United States Patent [19]
Karlsrud et al.

[11] Patent Number: 5,329,732
[45] Date of Patent: Jul. 19, 1994

[54] WAFER POLISHING METHOD AND APPARATUS

[75] Inventors: Chris E. Karlsrud; Anthony G. Van Woerkom, both of Chandler, Ariz.; Shigeru Odagiri, Yokohama, Japan; Isao Nagahashi, Fujisawa, both of Japan

[73] Assignee: Speedfam Corporation, Des Plaines, Ill.

[21] Appl. No.: 898,876

[22] Filed: Jun. 15, 1992

[51] Int. Cl.$^5$ .............................................. B24B 7/22
[52] U.S. Cl. .................................. 51/131.5; 51/132; 51/215 CP; 51/215 UE
[58] Field of Search .......... 51/283 R, 215 CP, 215 H, 51/215 UE, 215 HM, 215 AR, 131.1, 131.3, 131.5, 132, 134

[56] References Cited

U.S. PATENT DOCUMENTS

| | | | |
|---|---|---|---|
| 3,611,654 | 10/1971 | Weber et al. | 51/266 |
| 3,857,123 | 12/1974 | Walsh | 51/131 |
| 4,141,180 | 2/1979 | Gill, Jr. et al. | 51/5 R |
| 4,193,226 | 3/1980 | Gill, Jr. et al. | 51/124 R |
| 4,811,522 | 3/1989 | Gill, Jr. | 51/98.5 |
| 4,863,395 | 2/1975 | Brown | 51/121 |
| 4,918,870 | 4/1990 | Torbert et al. | 51/131.3 |
| 4,944,119 | 7/1990 | Gill, Jr. et al. | 51/215 R |
| 5,095,661 | 3/1992 | Gill, Jr. et al. | 51/131.3 |

FOREIGN PATENT DOCUMENTS

| | | | |
|---|---|---|---|
| 0042738 | 3/1980 | Japan | 51/134 |
| 0223561 | 12/1983 | Japan | 51/283 R |
| 0227361 | 12/1984 | Japan | 51/131.3 |
| 0241060 | 10/1986 | Japan | 51/131.3 |
| 0136365 | 6/1987 | Japan | 51/131.4 |

Primary Examiner—Robert A. Rose
Attorney, Agent, or Firm—Fitch, Even, Tabin & Flannery

[57] ABSTRACT

A wafer polishing apparatus includes a wafer polishing assembly having a plurality of wafer carriers for substantially simultaneously polishing a plurality of wafers against a rotating polishing surface. A plurality of wafers to be polished are substantially simultaneously loaded into the plurality of wafer carriers by wafer holding apparatus of an index table. Similarly, a plurality of wafer carriers are substantially simultaneously unloaded into wafer holding apparatus of the index table. The wafer carriers are individually computer controlled for exact polishing and different polishing requirements can be met at the same time by different wafer carriers.

14 Claims, 15 Drawing Sheets

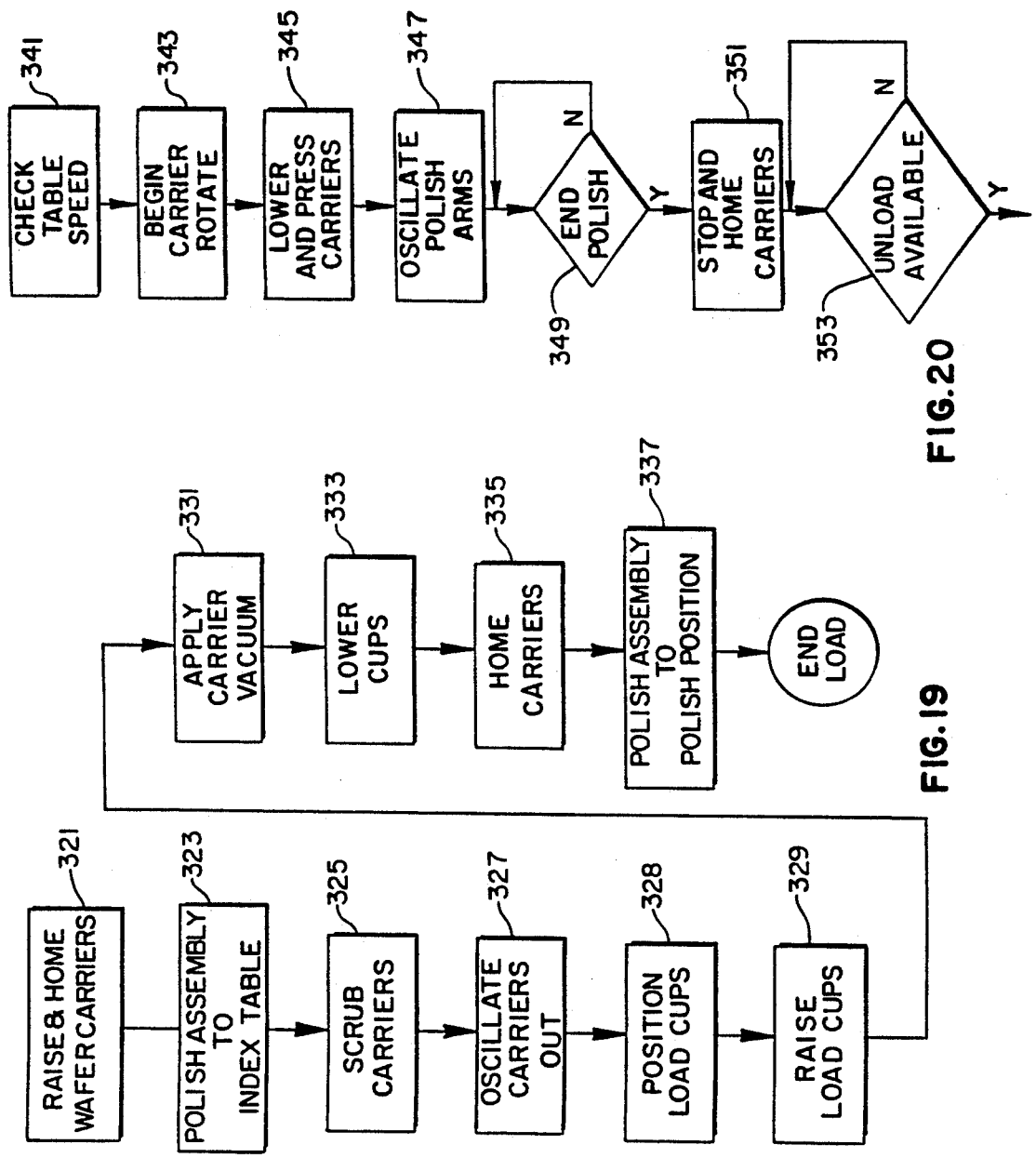

WAFER POLISHING METHOD AND APPARATUS

BACKGROUND OF THE INVENTION

This invention relates to polishing methods and apparatus and more particularly, to such methods and apparatus for accurately polishing wafers of semiconductor material with high throughput and in a manner compatible with semiconductor processing clean room environments.

The production of integrated circuits begins with the creation of high quality semiconductor wafers. Each wafer is of relatively high cost due to the detailed processing needed to produce it. During the integrated circuit production process, an extremely flat surface is desired on at least one face of the wafer. Wafer polishing to achieve such a flat surface is a known technique.

Such polishing generally includes attaching one side of the wafer to a flat surface of a wafer carrier or chuck and pressing the wafer against a flat polishing surface. The polishing surface is moved under the wafer, and the wafer may also be rotated about its vertical axis and oscillated back and forth to improve polishing action. The polishing surface is generally a pad attached to a rigid flat table which is rotated to provide movement and onto which an abrasive and/or chemical slurry is pumped. The joint functions of the pad, the slurry, and the relative movements of the components produces a combined mechanical and chemical process at the wafer surface which produces a highly flat surface on a wafer where surface variations are kept to less than, for example, 0.5 $\mu$m.

Polishing has typically been performed prior to integrated circuit fabrication so that a flat surface is available on the semiconductor wafer on which the circuit fabrication can take place. As integrated circuits increase in complexity, the conductive line widths have reduced considerably, making the focus and depth of field of the imaging process more sensitive to surface variations on the substrate. This has increased the desire for wafers with improved surfaces. Further during the integrated circuit fabrication process, layers of, for example, conductors and dielectrics, are built up on the wafer, on top of which other such layers are to be created. Thus, it has become necessary to "re-flatten" the wafer surface during the actual fabrication of the integrated circuit and not merely before it. The act of re-flattening is referred to as planarization. At each successive one of several planarization operations the wafer is considerably more valuable. Given semiconductor processing costs, it is quite possible that a single 8" partially processed wafer is worth $10,000 or more when planarization is performed. Great care in handling of each such wafer is obviously required.

Speed of wafer polishing has always been of interest but has become more important when planarization is one of the necessary sequential processing steps. Prior arrangements, typically, polish one or two wafers, with substantial waiting time to load and unload wafers. Methods and apparatus are needed to speed up the polisher process.

The increase in value of the wafers being polished has greatly increased the need for precision in the planarization process. Improper polishing of a wafer worth $100 is a completely different matter than improperly polishing one worth $10,000. Methods and apparatus are needed to provide improved polishing, particularly in a rapid production environment.

These needs are met by the present invention.

SUMMARY OF THE INVENTION

Wafer polishing apparatus in accordance with the present invention comprises a polishing assembly having a plurality of wafer carriers for substantially simultaneously engaging a plurality of wafers of material with a polishing surface. The apparatus includes an index table for holding wafers to be polished, and positioning apparatus to move the polishing assembly between the polishing surface and the index table. At the index table, all wafer carriers of the polishing assembly are substantially simultaneously loaded with wafers. After loading the carriers, the polishing assembly is positioned in polishing engagement with the polishing surface. By incorporating an index table into the apparatus, unpolished wafers can be loaded onto the index table in preparation for loading them simultaneously onto the wafer carriers, providing throughput advantages.

The index table indexes in increments when being loaded with unpolished wafers so that the wafers can be placed thereon one at a time, as retrieved from a multi-wafer cassette. The movement of unpolished wafers to the load cups advantageously occurs while the polishing assembly is at a polish position polishing another plurality of wafers. Upon completion of polishing, the assembly returns to the index table to receive substantially simultaneously another set of wafers to be polished.

The index table may also comprise a plurality of unload cups which are used in a similar manner to the load cups to substantially simultaneously remove polished wafers from the wafer carriers after being polished. The removal of polished wafers from the unload cups can then be performed while other wafers are being polished by the polishing assembly.

The alignment of polish assembly, index table and polishing surface is maintained by providing a stable framework in the apparatus. To this end, a linear track for moving the polishing assembly extends between the polishing surface and the index table. The linear track provides a stable, rugged frame while permitting controlled movement of the polishing assembly between the index table and the polishing surface.

The apparatus may also include an automatic arrangement for washing each wafer as it is removed from the index table. Such washing assures that the polished wafers removed from the apparatus are suitable for a clean room environment.

The apparatus is controlled by a computer which processes many separate feedback loops to maintain the accuracy of operations. For example, polishing pressure is applied at each wafer carrier by an air cylinder and applied pressure is sensed by a pressure sensor of each wafer carrier. Oscillation and rotation of each wafer carrier is provided by separate servo motors, the position and rotation rate of which is also sensed. Ranges of values for desired pressure and wafer carrier motion are established based on operator input. The computer then reads actual operating parameters measured by the sensors and adjusts the air pressure and servo motor motion to keep the actual parameters within the desired ranges.

The operator enters data indicative of operating parameters for each of the wafer carriers being used. These parameters then form the basis of the desired ranges which are separately stored in the computer. Advantageously, the operator can establish the same or different parameters for each wafer carrier. Since each wafer carrier is controlled by the computer in accordance with variables stored for that wafer carrier, the apparatus can differently process wafers on separate wafer carriers.

Each wafer carrier of the preferred embodiment includes an upper force conveying member having a central axis for conveying pressure forces along the central axis and rotational forces about that central axis. A polishing member of the wafer carrier comprises a flat lower surface having a polishing axis. Pressure forces are coupled between the force conveying member and the polishing member by a force coupling member including a first race member symmetrically disposed about the central axis of the force conveying member, a second race member symmetrically disposed about the polishing axis of the wafer carrier, and ball bearings held between the first and second race members. The first race member, the ball bearings, and the second race member cooperate to focus pressure forces through the force coupling member to a point on the polishing axis. Further, rotational forces are conveyed by a plurality of cam followers disposed about the periphery of the force conveying member which abut bearing surfaces on the polishing member, to couple rotational forces. After the force conveying member is inserted into a cylindrical opening in the polishing member, it is held in place resiliently by a collar which includes a plurality of springs for holding the force conveying member in the cylindrical opening of the polishing member, to maintain pressure on the ball bearings.

A lower flat surface of the polishing member includes a plurality of holes therethrough which communicate with a central passage into the force conveying member. This hollow passage is sealed by flexible means to permit relative motion of the polishing member and the force conveying member, while providing a substantially fluid-tight communication channel.

The polishing member also includes a lip around its polishing surface to provide additional support for wafers carried thereby. In the preferred embodiment, the lip comprises a ring of material having threads on an inner surface thereof, which engage with threads around the outer surface of the polishing member. The height of the resulting lip can be carefully adjusted by controlling the depth to which the threads of the ring and the polishing member are engaged. Advantageously, a collar is applied over the ring, which collar frictionally engages the ring to keep it from rotating and becoming misadjusted.

BRIEF DESCRIPTION OF THE DRAWINGS

In the Figures of the drawing, like reference numerals identify like components, and in the drawing:

FIGS. 17–22 are flow diagrams of process control for the wafer polishing system of FIG. 1.

DETAILED DESCRIPTION OF THE PREFERRED EMBODIMENT

Figure 1:
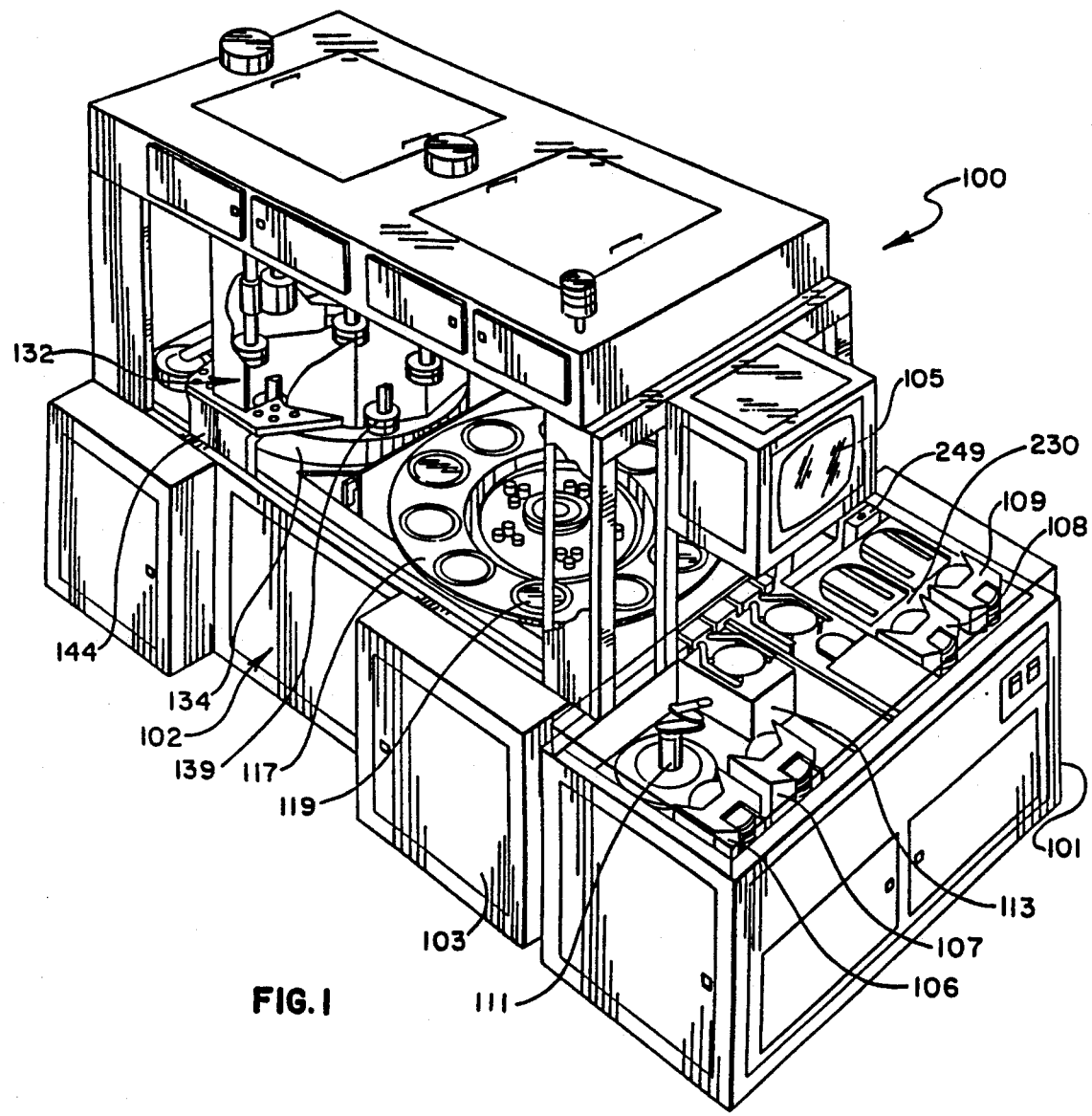
FIG. 1 is a perspective view of a wafer polishing system embodying the present invention.

FIG. 1 is a perspective view of a wafer polishing apparatus 100 embodying the present invention. Wafer polishing apparatus 100 includes a wafer input/output module 101 and a wafer process module 102. The wafer polishing apparatus 100 is constructed so that input/output module 101 can be placed, for example, inside a class 10 clean room environment while the process module 102 is placed beyond an adjacent wall perhaps in a class 1000 clean room environment. By means not specifically shown, air flow is created within the polishing system and the air pressures are regulated such that the environment of the class 10 clean room is not negatively influenced.

Figure 2:
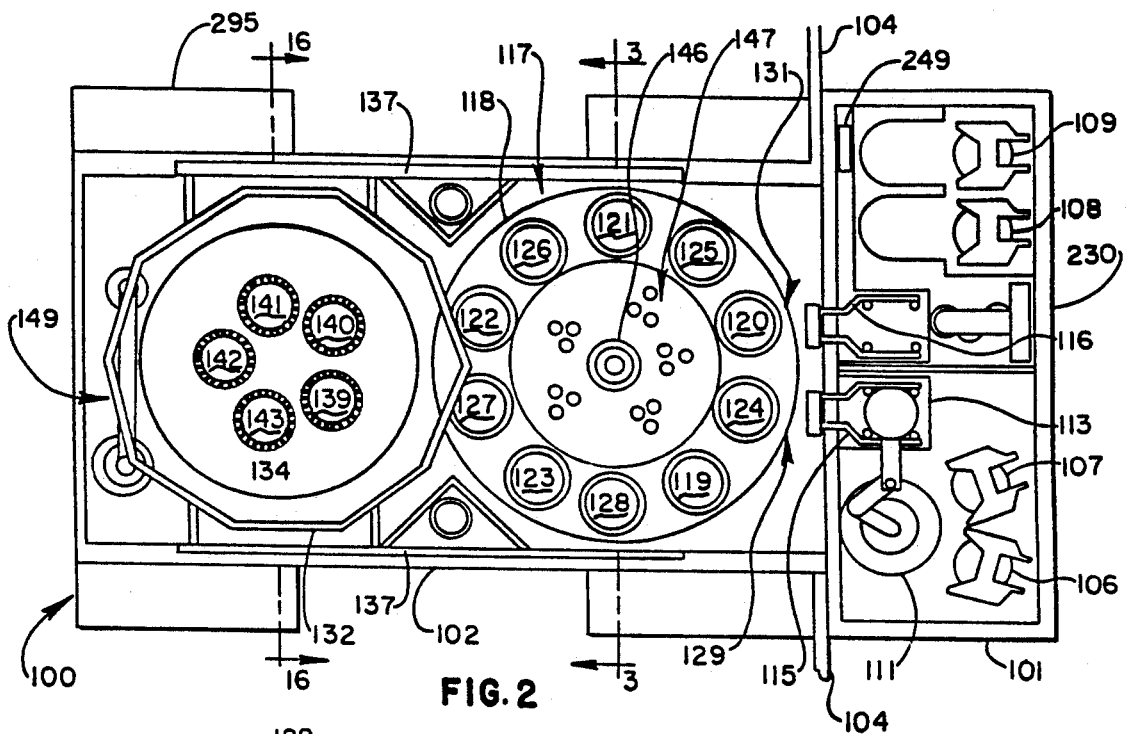
FIG. 2 is a plan view of the system of FIG. 1 with the top thereof removed.

FIG. 2 is a top view of wafer polishing apparatus 100 in which the top and certain other structure of the perspective view has been removed for ease of understanding. Additionally in FIG. 2, a wall 104 is represented showing separation of input/output module 101 and process module 102 thereby. Wafers are presented to and removed from input/output module 101 by means of multi-wafer cassettes, of which two input cassettes 106 and 107 and two output cassettes 108 and 109 are shown in FIGS. 1 and 2. Cassettes 106 through 109 are of a type known in the art which store in substantially horizontal orientation up to 25 wafers of a pre-chosen diameter. In the present description, 8" wafers are discussed. Each of the cassettes 106 through 109 has closed side and rear portions, with an open front portion for the loading and unloading of the wafers. Input/output module 101 also includes a 3-axis loading robot 111 which, by means known in the art, removes wafers from cassettes 106 and 107 one at a time and places them on an aligner unit 113. Loading robot 111 may, for example, be a Model 351 by ADE and aligner 113 may, for example, be a Model 428 by ADE. Aligner unit 113 centers the wafer presented thereto by robot 111 and positions it for the reading of a bar code on the wafer. After alignment of the wafer, an input gripper 115 grips the edges of the aligned wafer.

Processing module 102 includes an index table 117 which is used to receive wafers from, and provide wafers to, input/output unit 101. Index table 117 comprises a rotatable annular ring 118 including five wafer unload cups numbered 119 through 123 and five wafer load cups numbered 124 through 128. Unload cups 119 through 123 are disposed at 72° increments about the vertical center axis of index table 117, and load cups 124 through 128 are similarly disposed at 72° increments about the vertical axis in alternating positions with the unload cups. Thus, a wafer cup is present at 36° increments about the rotatable member 118, and the load and unload cups are alternatingly disposed.

Figure 3:
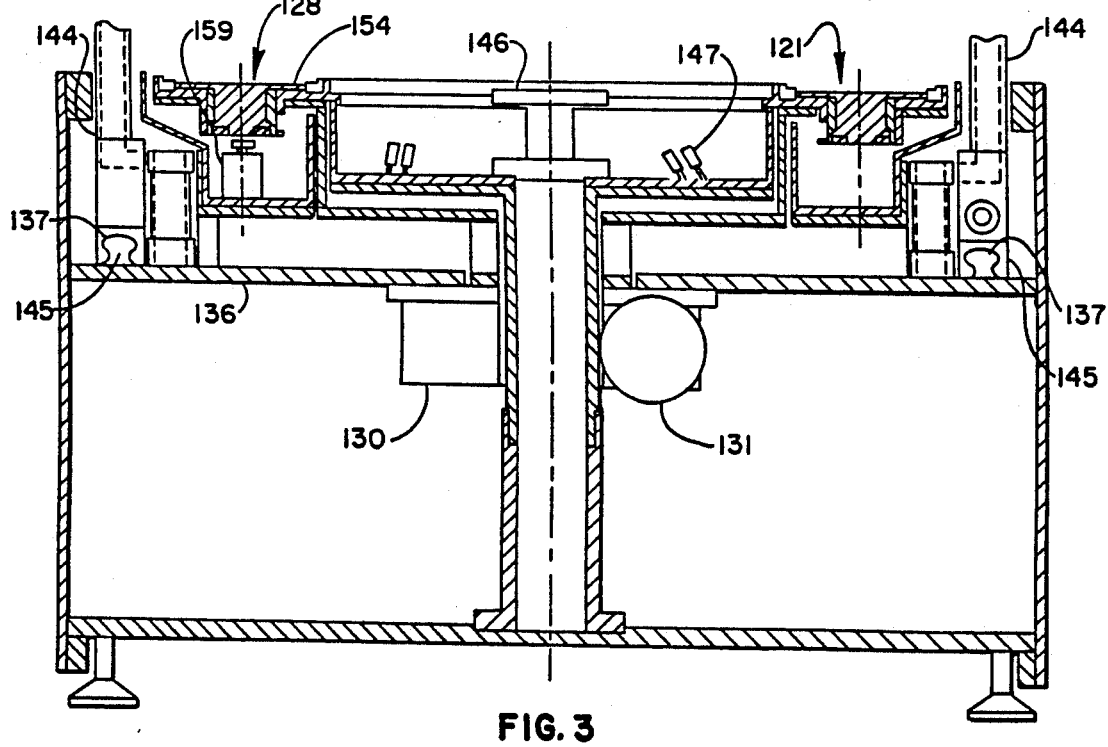
FIG. 3 is a sectional view of the wafer polishing system through an index table thereof.

Index table 117 can be rotated through 360°, and is primarily rotated in integer multiples of 36° in the counterclockwise direction (FIG. 2) to position wafer cups 119 through 128 for input/output operation and to load and unload wafers in groups of five to and from a polish assembly 132. Any indexing in the clockwise direction is specifically identified herein. Two positions of index table 117 are identified in FIG. 2. One position 129, called the input position, occurs when table 117 has an input cup adjacent to the input gripper 115. In FIG. 2, load wafer cup 124 is in input position 129. A second position 131, called the output position, occurs when table 117 has an unload cup, adjacent to an output gripper 116. In FIG. 2, cup 120 is in the output position 131. In the present embodiment, all loading and unloading of wafers to and from polish assembly 132 occurs with wafer cups of the type in the input position, that is, load functions of assembly 132 are performed when a load cup is in the input position 129 and unload functions are performed when an unload cup is in the input position 129. To implement loading and unloading of the wafer cups, an air cylinder 159 is disposed under index table 117 in a position to engage the wafer cup at the input position 129. Four additional air cylinders 159 are disposed similarly under index table 117 at 72° increments from the input position. FIG. 3 is a representation of the process module 102 taken along section line 3—3 and shows a sectional view of index table 117 and certain associated apparatus.

Figure 4:
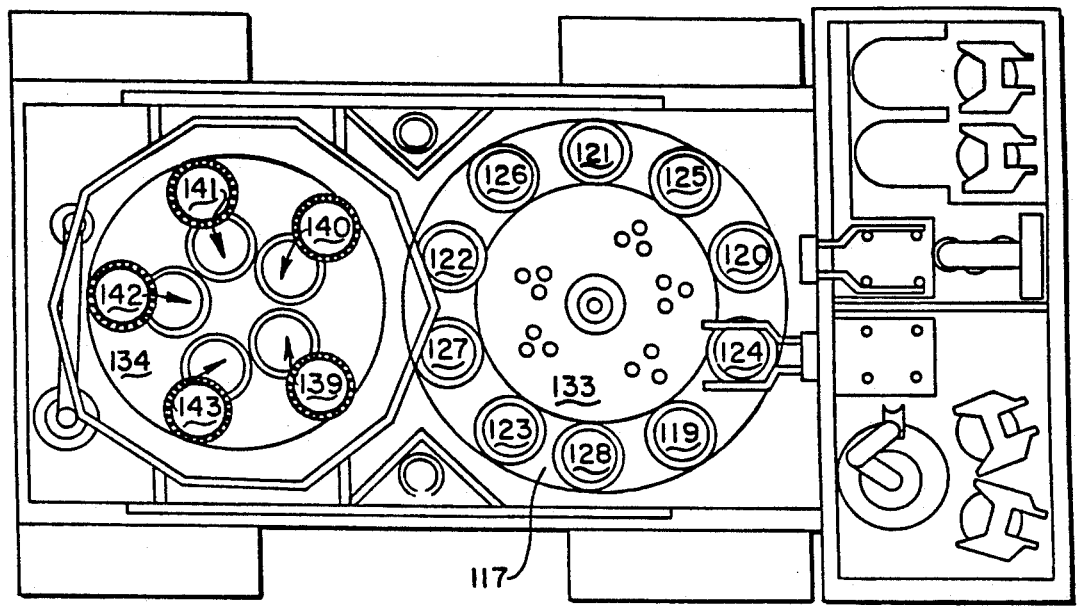
FIGS. 4 and 5 are additional plan views of the system illustrating different parts of the wafer polishing process.

When a wafer has been aligned by aligner 113, and an empty load cup 124, is present at input position 129, input gripper 115 grips the aligned wafer and rotates it vertically 180° to place the newly aligned wafer in input cup 124, as shown in FIG. 4. After cup 124 has received a wafer, the index table 117 is rotated by 72° counterclockwise under the control of an index drive system 130 driven by AC servo motor 131 (FIG. 3) to place the next available load cup, e.g. 128, in the input position 129 to receive an aligned wafer. Index table drive system 130 operates under the control of computer 103 to perform its indexing operation. By alternatingly loading load cups and indexing index table 117, all five load cups 124 through 128 will be loaded with wafers awaiting polishing and load cup 124 is again in the input position 124. No further input operations are performed until the five load cups have been emptied as is described below.

Figure 5:
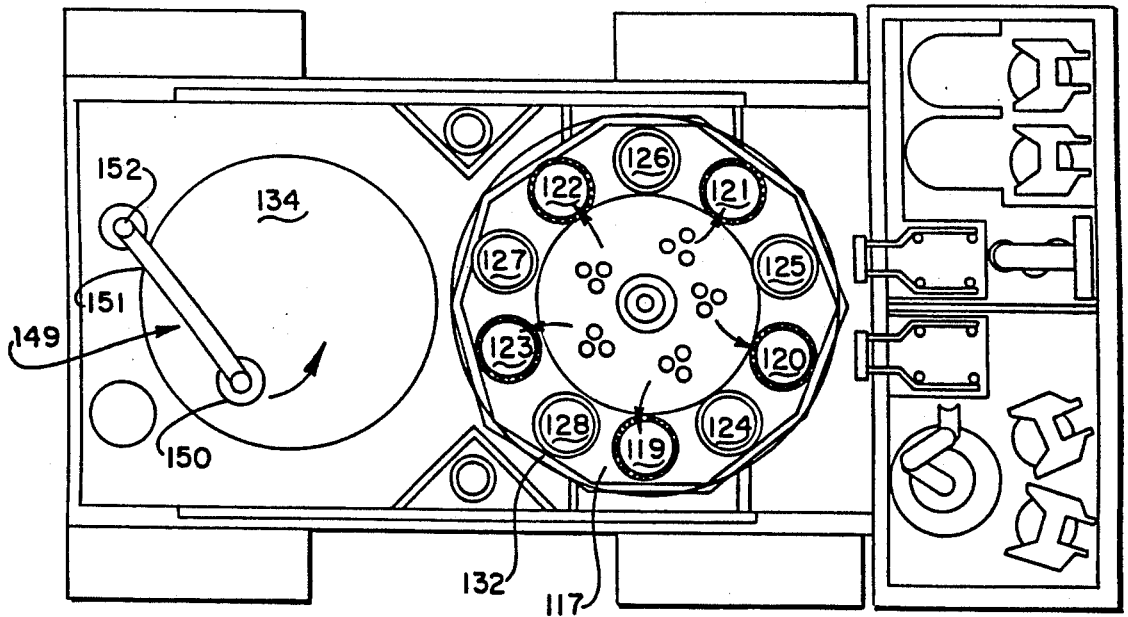

In the present embodiment, wafers are polished five at a time by a multi-head wafer polish assembly operating in conjunction with a rotating polishing table 134. The multi-head polish assembly 132 is shown in cutaway view in FIG. 1 and is represented in FIGS. 2, 4 and 5 as a transparent decagon. The details of construction of polish assembly 132 are provided later herein. Polish assembly 132 includes five wafer carriers 139-143 and is capable of simultaneously pressing five wafers onto rotating polishing table 134 while at the same time rotating each wafer and oscillating each wafer back and forth between two circumferences on rotating polish table 134. In FIGS. 2, 4 and 5, the wafer carriers 139-143 are represented by circles having wide darkened perimeters. The two circumferences between which wafer carriers 139 and 143 can oscillate consist of a home position as shown in FIG. 2 and a maximum outward oscillation position as shown in FIG. 4. When wafer polishing is completed or when the wafer carriers 139 through 143 are empty, they are raised to a significant height above polish table 134. When the wafer carriers 139 through 143 are raised, they are also brought into the home position of oscillation.

Figure 8:
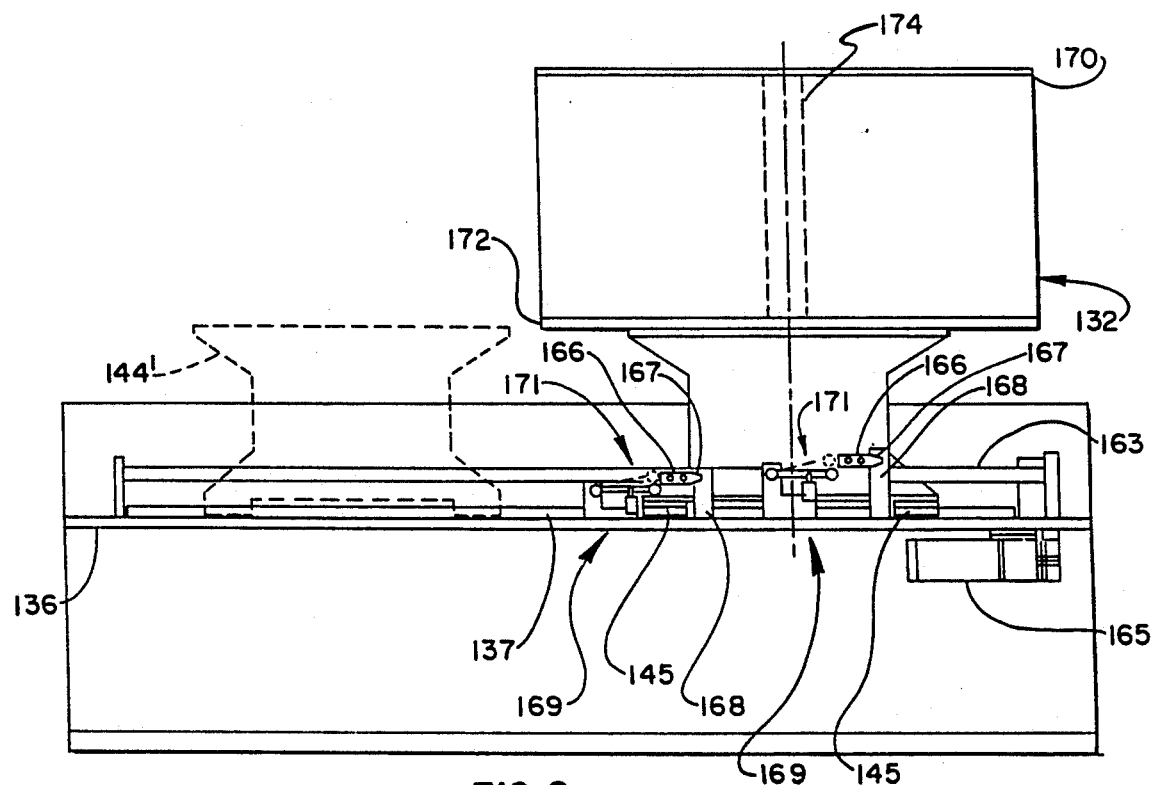
FIG. 8 is a side view illustrating a wafer polish assembly and its motion within the system.

When index table load cups 124 through 128 each contain a wafer to be polished, those wafers must be transferred to the wafer carriers 139 through 143 before polishing can begin. The loading of wafers into wafer carriers 139-143 begins with the movement of polish assembly 132 from a position over the polish table 134 to a position over the index table 117. As shown in FIGS. 3 and 8, polish assembly 132 is attached to a main structure plate 136 of process module 102 by means of a pair of transport rails 137 running the length of process module 102 between rotating polish table 134 and index table 117. Polish assembly 132 is connected to rails 137 by means of a transport frame 144 which is connected to rails 137 by four transport linear bearings, such as THK bearings No. HSR 35CB2UU. Linear motion along rails 137 is controlled by a motor driven transport ball screw such as THK No. BLK 3232EZZ, which is driven by an AC servo motor 165. FIG. 5 shows the position of transport head polish assembly 132 over index table 117 at the completion of linear motion from polish table 134. The loading operation begins when the five wafer carriers 139 through 143 are lowered into a tub 133 formed at the center of the annular ring 118 and they are rotated against a brush 146, while at the same time being sprayed by a solvent, such as water, from a plurality of nozzles 147. Wafer carriers 139 through 143 are then raised to their maximum upward position and oscillated outward to their maximum outward position. By prealignment of wafer carriers 139-143 on polishing assembly 132 and proper indexing of the rotation of index table 117, each wafer carrier 139 through 143 is above and in substantial vertical alignment with one of the cups of index table 117. When a load operation is to be performed, table 117 is positioned (FIG. 4) so that load cups 124-128 are in vertical alignment with wafer carriers 139 through 143 while, when an unload operation is to be performed (FIG. 5), index table 117 is positioned to provide vertical alignment between unload cups 119-123 and the wafer carriers 139 through 143.

In the present description, we will assume that wafer carriers 139 through 143 have just completed a polish operation and each contains a wafer to be unloaded. FIG. 4 shows the relative position of index table 117 after receiving wafers from input/output module 101. In order to align unload cups with wafer carriers 139 through 143 for the unloading operation, index table 117 is indexed by one 36° step clockwise, resulting in the position of load and unload cups as shown in FIG. 5. Upon such proper positioning, an unload wafer operation is substantially simultaneously performed between unload cups 119 and 123 and respective ones of wafer carriers 139 through 143. Upon completion of such an unload operation, wafer carriers 139 through 143 may be returned to the home position and lowered again for additional cleaning by brush 146 and nozzles 147. When the carriers 139-143 are to be loaded with new wafers for polishing, they are raised and oscillated to their maximum position once again and index table 117 is rotated by a 36° counterclockwise increment so that load cups 124 through 128 are in vertical alignment with wafer carriers 139 through 143. Once such alignment is achieved, a carrier load operation is performed to substantially simultaneously load all five wafer carriers. Also, as shown in FIG. 5, while the multi-head polish assembly is engaged in loading and unloading operations over the index table 117, the rotary polishing table 134 may be renewed by means of an abrasive pad treatment arrangement 149. Pad treatment arrangement 149 consists of a rotating head 150 having an abrasive on its lower surface. The rotating head is oscillated back and forth across the polish table 134 to prepare the surface for another polishing session. The surface preparation member 149 carries rotating head 150 on an oscillating member 151 supported at a pivot point 152.

Figure 6A:
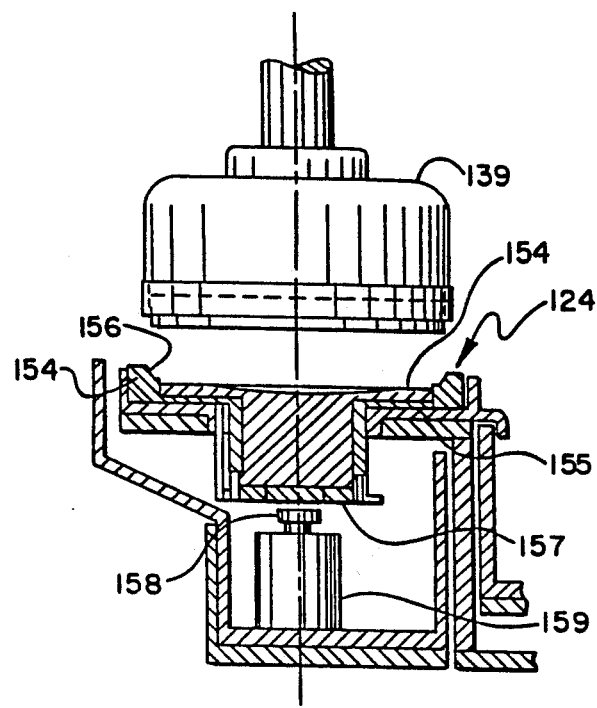
FIGS. 6a and 6b are sectional views illustrating wafer loading.
Figure 6B:
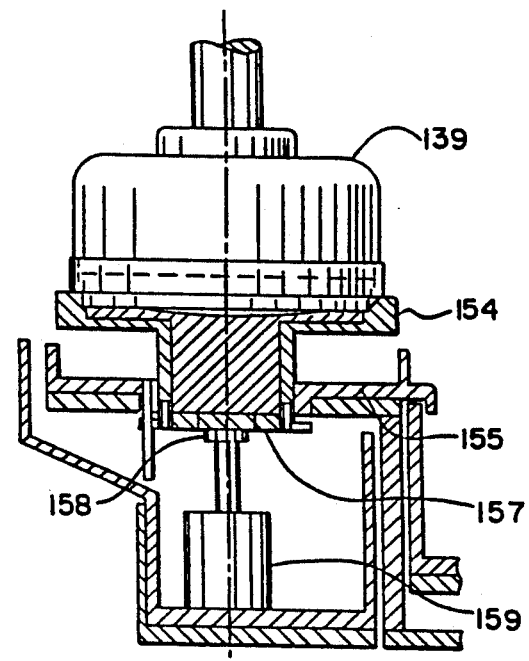

The wafer carrier load operation with respect to an exemplary wafer carrier 139 is illustrated in FIGS. 6a and 6b. Each load cup, e.g. 124, comprises a movable insert 154 and a support member 155 therefor. Support member 155 comprises primarily a flat supporting surface of rotatable member 118 with an aperture therethrough to permit upward and downward travel of the cup insert 154. The cup insert 154 is made of a material such as Delrin TM to be gentle to the wafers being handled, and includes an angled surface 156 having an uppermost inner diameter somewhat larger than the outer diameter of the lowest point of wafer carrier 139 and a lower inner diameter substantially equal to the outer diameter of wafer carrier 139. The angled surface 156 of the wafer cup provides self-guiding alignment between the wafer cup and the bottom of a wafer carrier during load and unload operations. Each load cup 124-128 also includes a bottom member 157 for engagement with a piston 158 of air cylinder 159. The thickness of bottom member 157 and the travel of piston 158 is such that, when the piston is actuated, as represented in FIG. 6b, the cup insert will be driven upward onto the lower face of wafer carrier 139 so that the wafer carried by cup insert 154 is substantially in contact with a lower flat surface 261 of wafer carrier 139. When piston 158 is at its upper travel position, a vacuum is presented through holes in the flat lower surface 261 of wafer carrier 139 to secure the wafer onto the surface. Thereafter, air cylinder 159 is deactivated, lowering the cup insert 154 into cup support member 155. Prior to lowering cup insert 154 it may be desirable to perform a vacuum test to assure that the wafer in each cup insert 154 has been secured to wafer carrier 139.

Figure 7A:
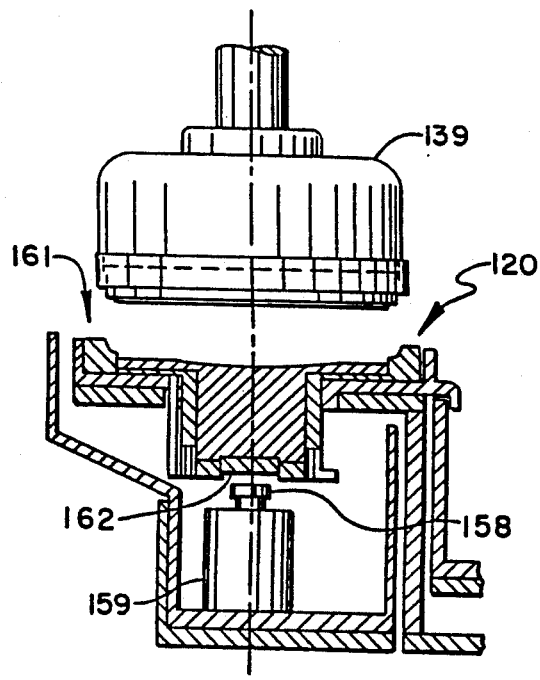
FIGS. 7a and 7b are sectional views illustrating wafer unloading.
Figure 7B:
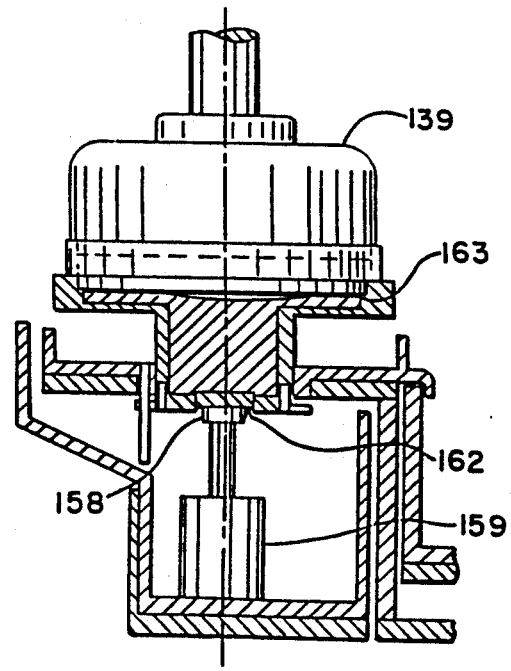

FIGS. 7a and 7b represent the similar process of unloading a wafer from exemplary wafer carrier 139. Unload cup 120 includes a cup insert 161 having substantially the same upper properties and dimensions as cup 154 of load cup 124. The bottom member 162 of unload cup insert 161 is, however, positioned slightly farther from the top of piston 158 of air cylinder 159. This slightly larger spacing than in the load cups results in cup insert 161 being moved upwardly to a slightly lower position under wafer carrier 139. When in the upward position, vacuum to the surface 261 of wafer carrier 139 is terminated and the wafer is allowed to separate from wafer carrier 139. It may be desirable to provide a positive flow of fluid such as air or water to force the wafer from the face of carrier 139. The positioning of cup insert 161 permits the wafer to drop for a small distance, represented by 163, before being caught by the cup insert. This distance assures that the wafer has separated from surface 261 of wafer carrier 139. A vacuum test may be performed to assure that the wafer has actually separated from the face of wafer carrier 139. On the completion of the unload sequence, air cylinder 159 is deactivated and insert 161 returns to its resting position on the surface 155 of index table 117.

After polished wafers have been placed in unload cups 119-123 and unpolished wafers have been loaded into wafer carriers 139 through 143, the wafer polish assembly 132 is moved along rails 137 to a position over rotary polish table 134. FIG. 8 shows in side view, the movement along the side rails 137. FIG. 8 includes a dashed representation of a transport frame 144' in the left-hand or index position, and a second solid line representation of transport frame 144 shown in the right-hand or polish position. It is to be noted that only one such transport frame is present in the embodiment, both being shown to indicate the range of linear movement of the polish assembly 132. When in the polish position, four wedges 166 carried by transport frame 144 engage respective slots 167 in associated support members 168 attached to main plate 136. Two such wedges are shown in FIG. 8, the other two being carried on the opposite side of transport frame 144. Upon engagement between wedges 166 and slots 167, four solenoids 169 are actuated to rotate a roller-ended lever arm 171 into engagement with wedges 166, to maintain a tightly fitting relationship between wedges 166 and slots 167. By the operation of wedges 166 and support members 168, upward forces created by the pressure of wafer carriers 139-143 on the table 134 are borne by the support members 168 and are not by bearings 145. Polish assembly 132 is moved along rails 137 in response to the rotation of transport ball screw 163, which is driven by AC servo motor 165 in response to commands from computer 103.

Wafer polishing is accomplished by the combined action of the wafer carriers 139-143 of polish assembly 132, and the motion of polishing table 134 operating in the presence of an abrasive and/or chemical slurry. FIG. 16 shows a sectional view of process module 102 along sectional line 16—16, through polishing table 134. Polishing table 134 is rotatably supported on a central shaft 282 above main structure plate 136 by a bearing member 281. Shaft 282 extends through plate 136 and is connected by a drive belt 283 and pulley 284 to an output pulley 285 of polish table motor 280. Motor 280 operates in response to commands to an interface 442 of the type well known in the art, to closely regulate rotational speed of polishing table 134. FIG. 16 also shows a pair of slurry nozzles 221 which distribute slurry onto table 134 from a slurry pump 223 (FIG. 15) operating under the control of computer 103.

Table 134 comprises a disc-shaped upper surface 286, which is carried by a support frame 288, for supporting the upper surface 286 and defining at least one cooling fluid chamber 293. Shaft 282 has a hollow channel 291 along its central axis and includes a tube 290 disposed therein to define two fluid channels. One fluid channel is within tube 290 and the second is in the annular spacing between tube 290 and the inner surface of channel 291 during operation. Cooling fluid is pumped via central tube 290 and a fitting 297 into channel 293. Warmed water from channel 293 flows through the annular channel around tube 290 and is returned to a heat exchanger 295 (FIG. 2) through fitting 297. Heat exchanger 295, which includes a fluid pump (not shown), continues to circulate and cool the operating fluid to maintain a reduced temperature at polish table 134.

Figure 9:
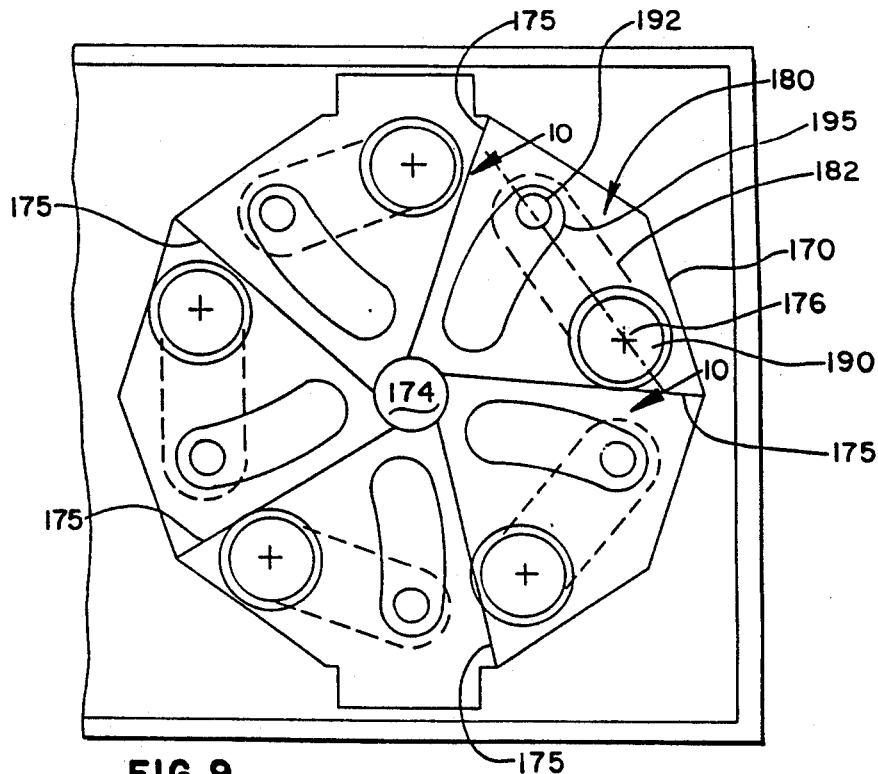
FIG. 9 is a plan view of the wafer polishing assembly.

The polishing assembly 132 shown in plan view in FIG. 9 includes five independent polishing units, each in a separate zone defined within the polish assembly. The structure of assembly 132 comprises an upper steel plate decagon 170 separated from a lower parallel steel plate decagon 172 by a central steel support member 174 and five zone-defining steel plates 175, as shown in top view in FIG. 9. The support member 174 is welded to the upper and lower plates 170 and 172, and each of the zone-defining plates 175 is welded to the length of the support member 174 and to the upper and lower plates 170 and 172. An oscillating polish arm 180 is pivotally mounted within each zone of the polish assembly 132 to oscillate horizontally about a vertical axis through a point 176. In response to control signals from computer 103, oscillating polish arm 180 regulates the position of one wafer carrier, e.g. 139, its pressure on rotating polish table 134 and the rotation rate of the wafer carrier 139.

Figure 10:
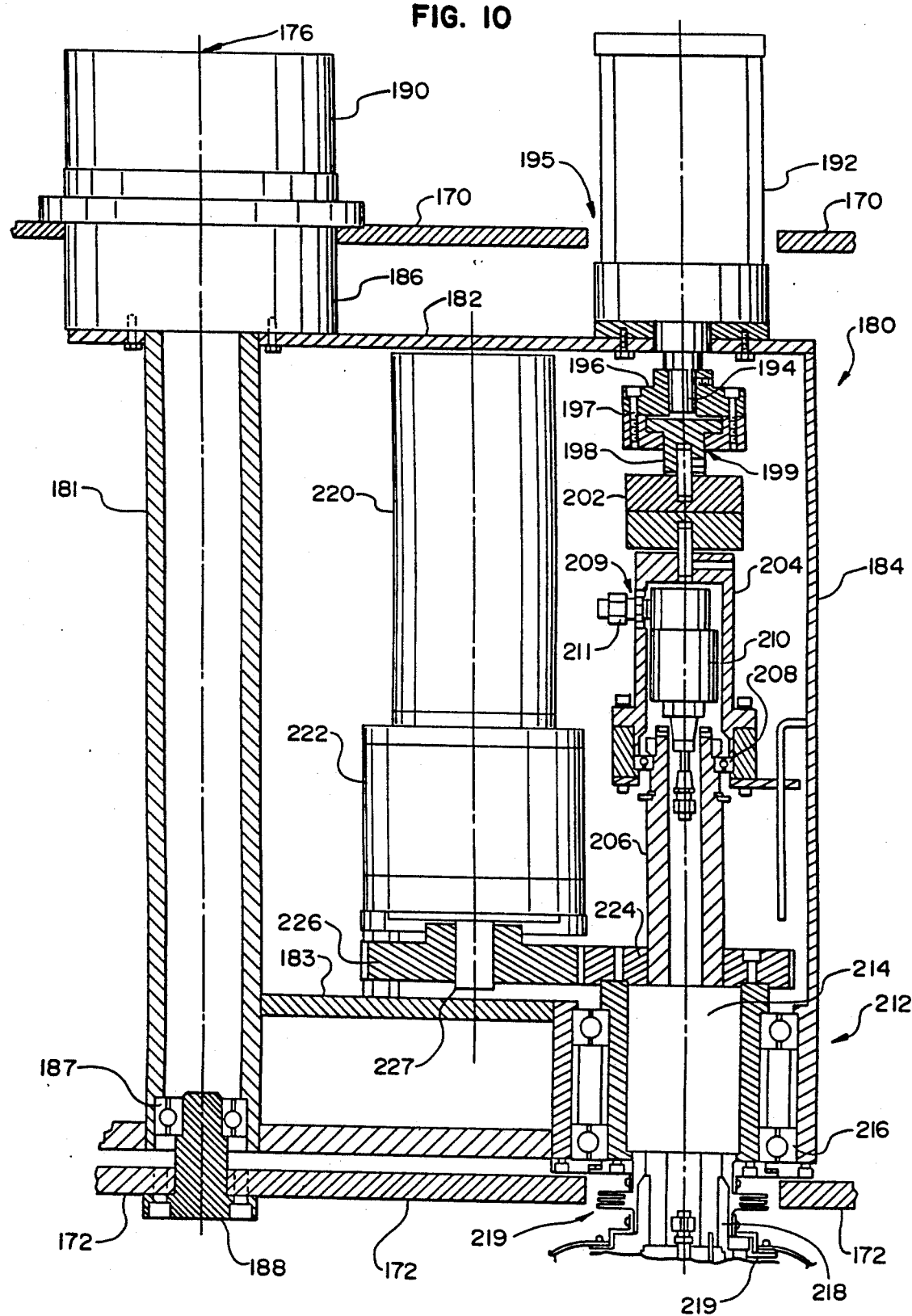
FIG. 10 is a sectional view of a polish arm assembly included in the wafer polishing assembly.

An oscillating polish arm 180 is shown in detail in FIG. 10. Polish arm 180 comprises a vertical pivot column 181 to which is welded an upper horizontal support member 182 and a lower horizontal support I-beam 183. The free ends of member 182 and I-beam 183 are connected by an end member 184. The upper end of pivot column 181 is bolted to the rotating surface of a rotational speed reducer 186, which extends through an aperture in upper plate 170. In the present embodiment, speed reducer 186 is a Dojen speed reducer Series II, Model Number 04. The stationary portion of speed reducer 186 is bolted to the upper surface of plate 170. The lower end of pivot column 181 is supported by a bearing 187 and bearing support pin 188 attached to the lower plate 172 of housing 132. An AC servo motor 190 is connected to and drives speed reducer 186. By selectively energizing servo motor 190 to rotate clockwise or counterclockwise, the oscillation of the polish arm 180 about the vertical axis defined by column 181 is readily controlled.

The polish arm 180 supports the apparatus which controls the function of one wafer carrier, e.g. 139. The raising, lowering and downward forces on the wafer carrier are controlled by a double acting air cylinder 192 which is attached to the upper surface of polish arm upper member 182. Air cylinder 192, which may, for example, be a SMC Series NCA1 extends through an arcuate slot 195 formed in upper plate 170 so that free oscillation of arm 180 is not prevented. An output shaft 194 of air cylinder 192 is attached to a circular flange 196, which is connected to a cup-shaped member 197. Cup-shaped member 197 receives a bearing collar 198 through a circular aperture 199 in the cup-shaped member. The union of flange 196 and cup-shaped member 197 form a cylindrical chamber having larger dimensions than the flanged top portion of bearing collar 198, so that no transverse forces are conveyed from beneath the bearing collar 198 to the air cylinder 192. A bottom surface of bearing collar 198 is attached to a top surface of a force sensor 202 such as a Sensetel Model 41 load-cell, the bottom surface of which is attached to a hollow cylindrical force-conveying member 204. Force conveying member 204, which is connected at a bottom surface thereof to the periphery of a hollow carrier driving shaft 206 by a thrust bearing 208. Internal to hollow force-carrying member 204 is a fluid coupling 210 which, via an aperture 209 in force-conveying member 204, communicates fluids and vacuum to the hollow center of carrier driving shaft 206 via a fluid connection 211.

Carrier driving shaft 206 is supported at I-beam 183 by a ball spline and bearing assembly at 212, which holds shaft 206 from lateral movement but which permits upward and downward movement as well as rotation of the shaft. Assembly 212 comprises a ball spline collar 214, such as THK LBST50, which is held in place by a bearing 216, such as Torrington 9120K. The bottom end of driving shaft 206 is attached to a circular flange 218, which extends through an arcuate slot 219 in the bottom of plate 172 of assembly 132. Arcuate slot 219 is substantially identical to arcuate slot 195 and is present to permit oscillation of shaft 206 and carrier 139. The top of ball spline 214 is connected to a gear 224, which is rotationally driven by a gear 226 attached to an output shaft 227 of a speed reducer 222. An AC servo motor 220 provides rotational forces to speed reducer 222 and thus to shaft 206 under the control of computer 103.

Figure 13:
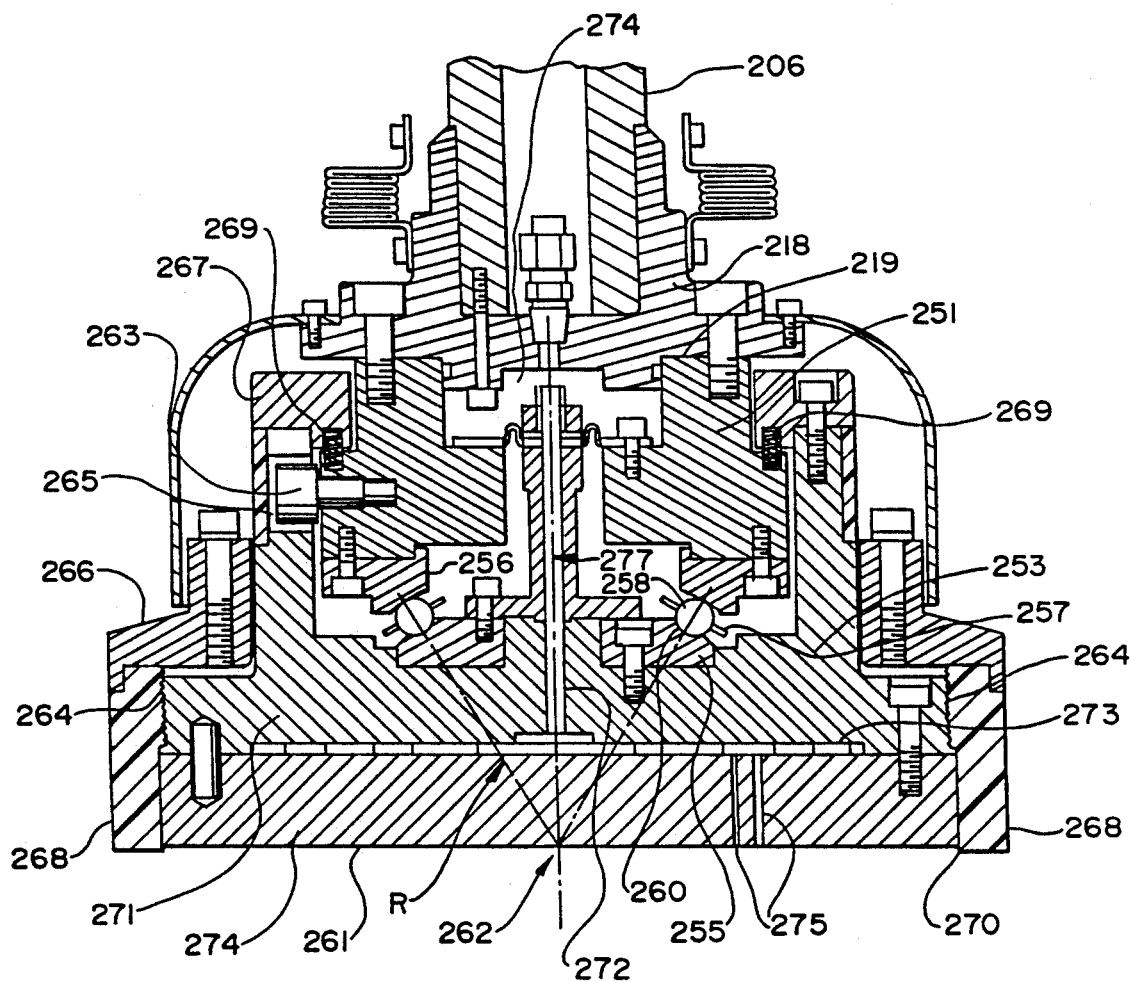
FIG. 13 is a sectional view of a wafer carrier which is a part of the wafer polishing assembly.

FIG. 13 is a sectional view of a wafer carrier 139 constructed to evenly distribute downward pressure forces and rotational forces from shaft 206 to a wafer carried by the wafer carrier. Wafer carrier 139 comprises an upper force-conveying member 251 of circular, horizontal cross-section which is bolted to the lower surface 219 of flange 218. Upper member 251 is received by a cylindrical upper opening of a lower force-conveying member 253 which is also shown in perspective view in FIG. 14. The outer diameter of upper member 251 is smaller than the inner diameter of the receiving cylinder of lower member 253, to permit alignment variations between the axis of driving shaft 206 and the axis of rotation of wafer carrier 139. The coupling between upper member 251 and lower member 253 comprises a bearinged gimble to maintain evenness of pressure across the flat surface 261 of the carrier 139 in the face of alignment variations.

Downward pressure forces are conveyed by a ball bearing assembly including a plurality of ball bearings 258, supported by a lower race 255 and retained by a retainer 257. As shown in FIG. 13, lower race 255 is attached to lower force member 253 about its central vertical axis, and includes a groove 260 for aligning the ball bearings 258. Pressure forces are applied to ball bearings 258 by an upper race 256, which is symmetrically attached about the vertical axis of the lower surface of upper force member 251. The bearing contacting surface of upper race 256 is shaped in the cross section shown, to have a radius R substantially equal to the distance to a predetermined point on the central vertical axis of lower member 253. In the present embodiment, the predetermined point is at the face-defining surface 261 of the wafer carrier 139, and is labeled 262. This configuration focuses the applied pressure forces on the center of the surface 261 for even force distribution. The configurations of races 255 and 256 may be chosen to raise or lower the force focus point from that shown; however, it is most desirable to focus the forces on the vertical axis.

Rotational forces are coupled from upper member 251 to lower member 253 by four cam followers 263, which are attached at 90° spacing around the cylindrical periphery of upper member 251. The outer rings of cam followers 263 are disposed in slots 265 (FIG. 14) which are spaced at 90° angles around the upright cylindrical portion of lower member 253. The slots, which are slightly wider than the diameter of the cam follower 263 outer rings for freedom of movement, are sufficiently long vertically to permit foreseeable ranges of required movement. Rotational forces are conveyed to lower member 253 when cam followers 263 abut the side (bearing) surfaces of the slots 265. Upper member 251 is held within lower member 253 by a collar 267 which is fastened to the lower member 253 after the insertion of the upper member 251 therein. In order to maintain pressure on ball bearings 258 and to allow freedom of movement between members 251 and 253, collar 267 includes a plurality of springs 269 which maintain a flexible downward pressure on upper member 251 from collar 267.

Figure 14:
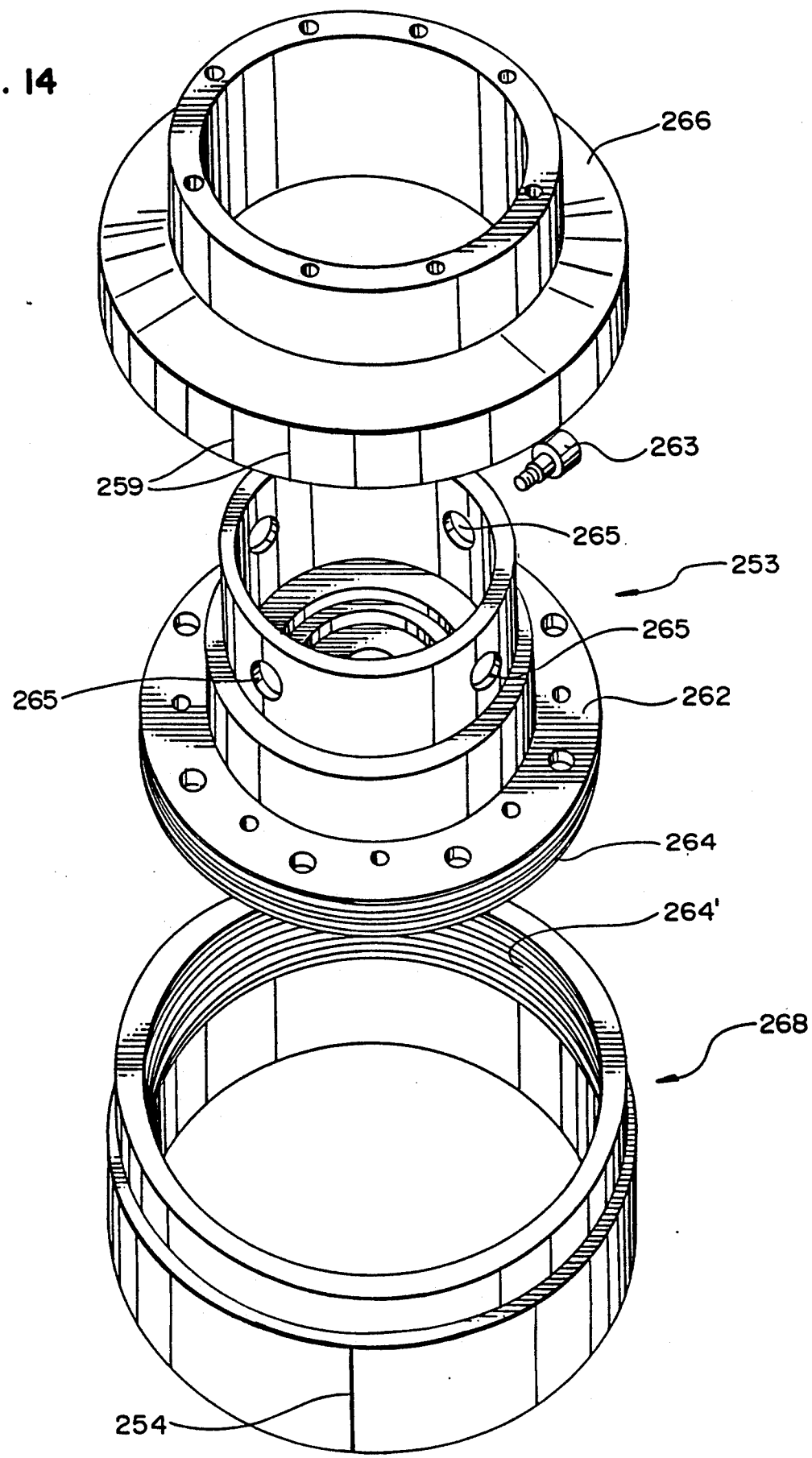
FIG. 14 is a perspective view of a lower force member which is part of the wafer carrier of FIG. 13.

Lower member 253 is produced in two sections so that fluid and vacuum can be communicated therethrough to surface 261. An upper section 271 of the lower member 253 has a plurality of channels 273 milled therein which communicate with a central aperture 272. The surface-defining lower section 274 of lower member 253 includes a plurality of holes 275 drilled therethrough for communication of fluids and vacuum between surface 261 and the milled channels 273. A cavity 274 is formed between the upper member 251 and flange 218, which cavity is sealed at its lower surface by a flexible gasket 276. Any fluid or vacuum which is communicated in the hollow center of drive member 206 is passed via cavity 274 to the holes in surface 261 by a channel 277, aperture 272, milled channels 273 and the holes 275 through surface member 274. The wafer carrier 139 also includes a hollow cylindrical ring 268 of plastic material, such as Delrin, which is disposed over surface member 274 to form an outer lip 270 for surface 261. The lip 270 is used to hold an attached wafer from sliding on surface 261, and the optimum height of lip 270 varies depending on the wafer thickness and other process variables. As shown in FIG. 14, an outer flange 262 of lower member 253 includes threads 264 on the outer surface thereof which mate with threads 264' on the inner cylindrical surface of ring 268. By threading ring 268 onto flange 262, the height of lip 270 can be finely adjusted by rotating the ring. When the desired height of lip 270 is achieved, it is frictionally engaged by a retaining ring 266 bolted to the lower member 253. Advantageously, scribe marks 259 can be placed around retaining ring 266, which marks can be compared to a reference line 254 on ring 268 during adjustment of lip 270 height.

Figure 11:
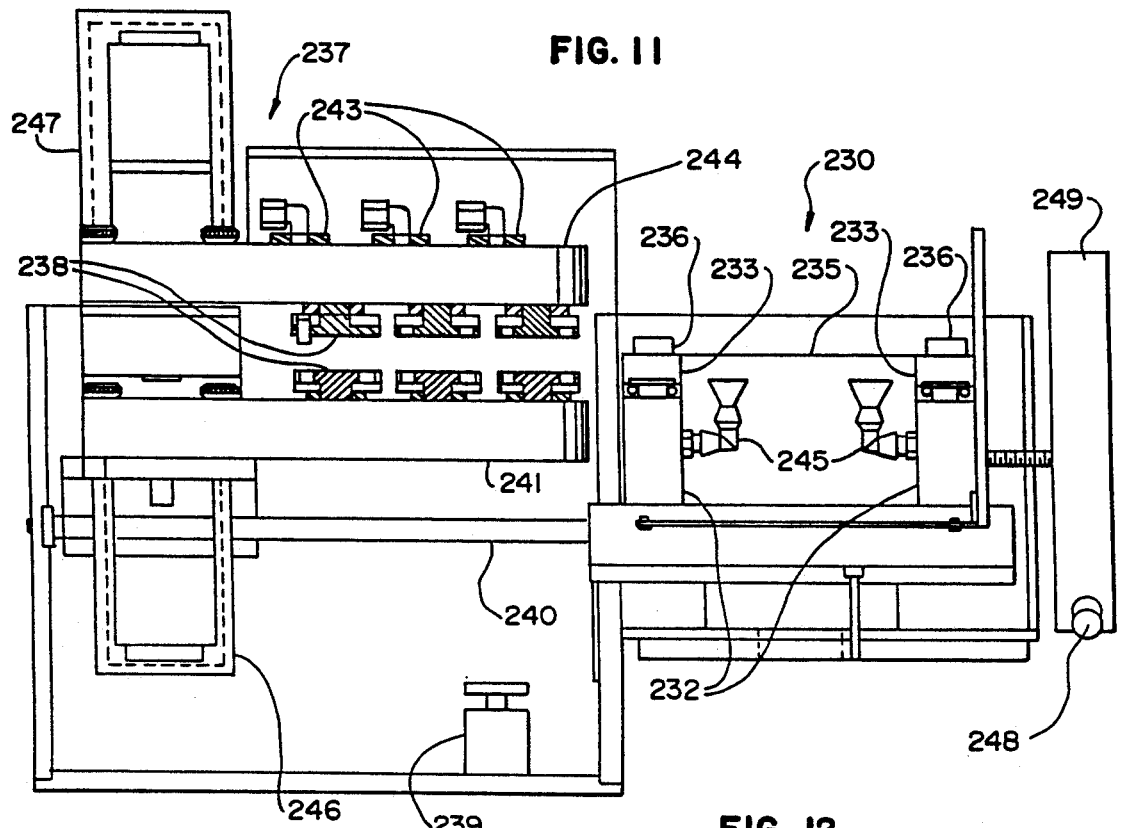
FIGS. 11 and 12 are side and top views of a wafer cleaning assembly.
Figure 12:
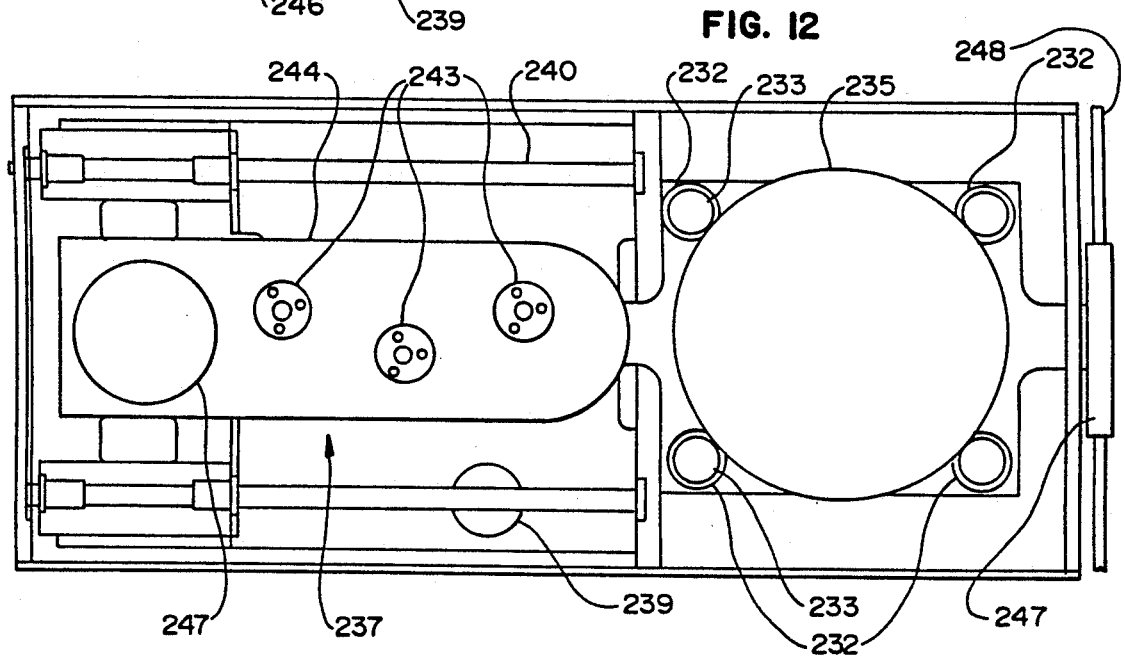

When the polish assembly 132 is at the polish table 134, the wafer output process of moving polished wafers from unload cups 119-123 of index table 117 into an output wafer cassette, e.g. 108, can take place. The wafer output process begins by placing index table 117 in a position in which unload cup 120 is in the output position 131. The output process begins when the wafer cup 117 at the output position is raised by an air cylinder 160 and unload gripper 116 edge grips the wafer 235 in unload cup 120, rotates it vertically and places it in water cleaning apparatus 230. Water cleaning apparatus 230 is shown in detail in side view FIG. 11 and top view FIG. 12. The unloaded wafer 235 is placed by gripper 116 on four spindles 232, each having a ball bearing mounted cap 233. The spindles 232 and caps 233 are positioned to support the perimeter of output wafer 235 on a ledge 236 of all four caps. A wash assembly 237 including six revolving brushes 238 is then driven to the right toward wafer 235 along guide shafts 240 to a position above and below the wafer. Upon such positioning, a bottom brush-carrying portion 241 of wash assembly 237 is moved upwardly by an air cylinder 239 to engage wafer 235 between the upper and lower sets of brushes 238. The brushes are then rotated by stepper motors 247 and 246 and belts (not shown), while deionized water is applied by a plurality of nozzles 243 in upper member 244 of wash assembly 237 and by a plurality of nozzles 245 mounted under the wafer 235. The asymmetrical placement of brushes 238 rotates the wafer 235 in the water, thereby cleaning its surface. After a preset time for completion of cleaning, washer assembly 237 is returned to its leftmost position and wafer 235 is raised by an elevator/arm apparatus 249 to a position above the water cleaning assembly 230. Elevator/arm assembly 249 is then moved along guide member 248 to a water slide 250 (FIG. 1), where the wafer 235 is released to slide by water flow into output wafer cassette 108. Advantageously, the wafer cassette 108 is kept submerged in water until being removed by an operator.

The method and apparatus described herein is controlled by the computer 103, which includes an INTEL 486 main processor, memory, and suitable input/output interfaces for controlling and sensing production processes. The computer assembly, which may be a VME Bus System, and its interface to production processes, are well known in the art and are not described in detail herein. Also, each of the servo and stepper motors described includes an associated position and/or rate sensor which is used by the computer 103 in closed loop feedback control of the rotation and position of the motor. Such position and rate sensors are also well known in the art. Further, although the computer 103 is capable of communicating with a process control master computer (not shown) which may be in control of an entire wafer production process, such master computer or communication is not needed for the present method and apparatus and is therefore not described herein.

Figure 15:
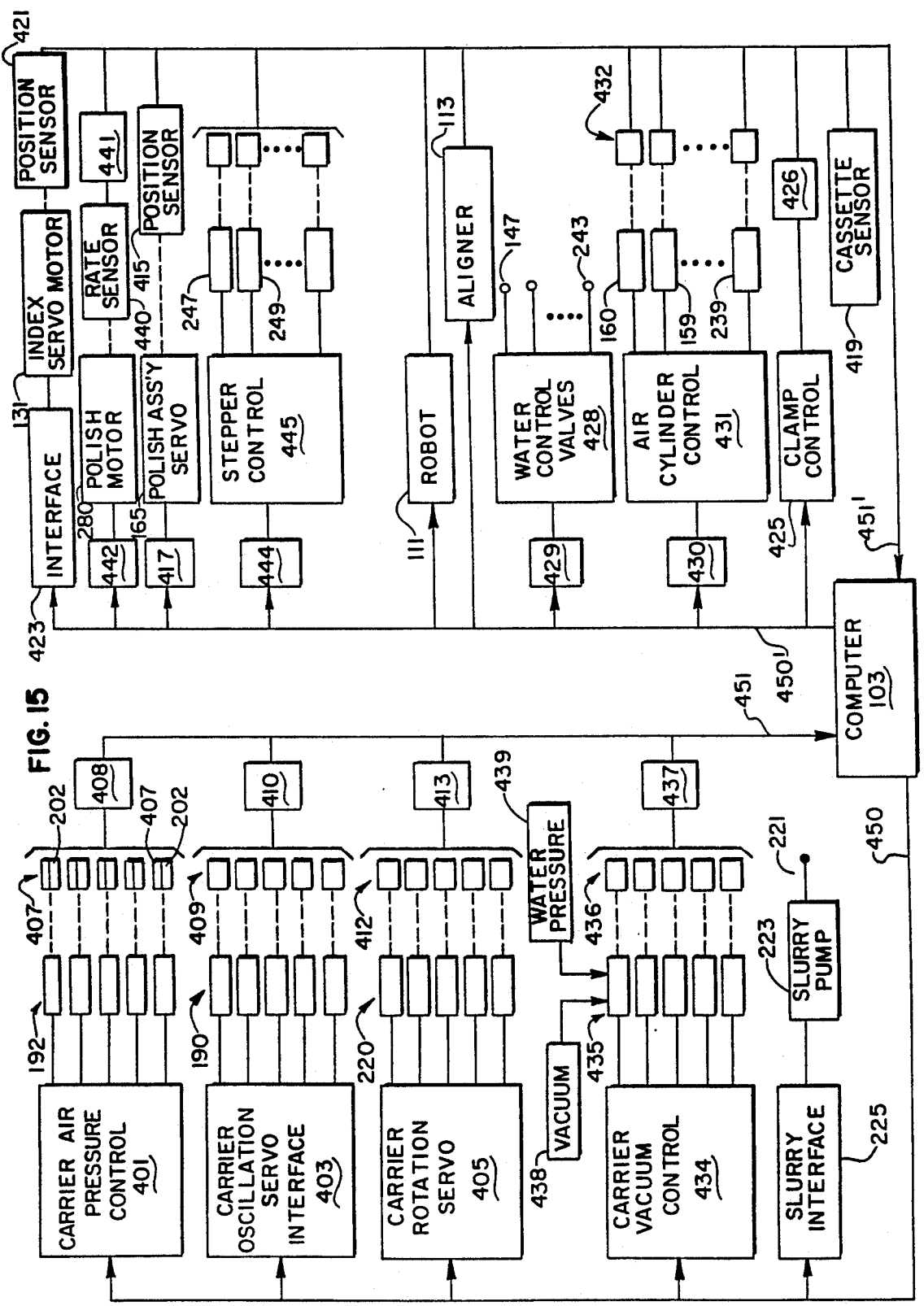
FIG. 15 is a block diagram of control apparatus for the wafer polishing system.
Figure 16:
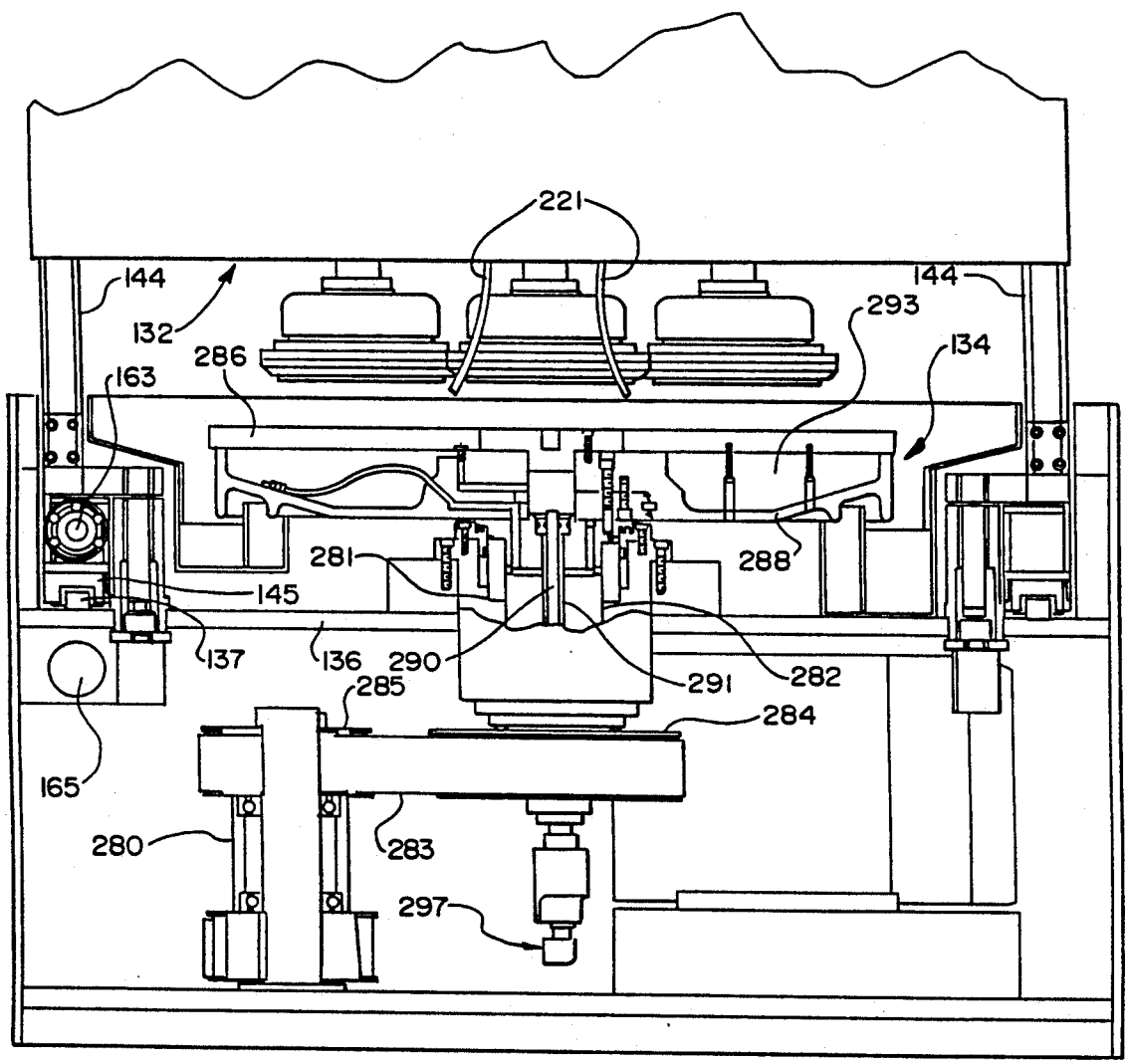
FIG. 16 is a sectional view of the wafer polishing system sectioned through a polishing table thereof.
Figure 17:
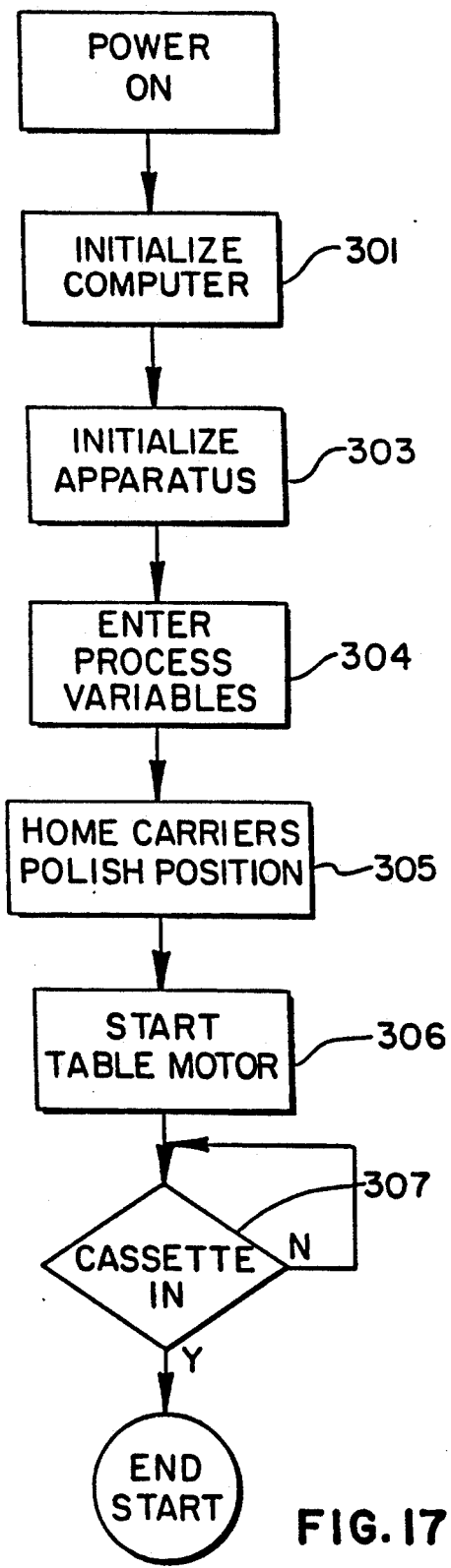
Figure 18:
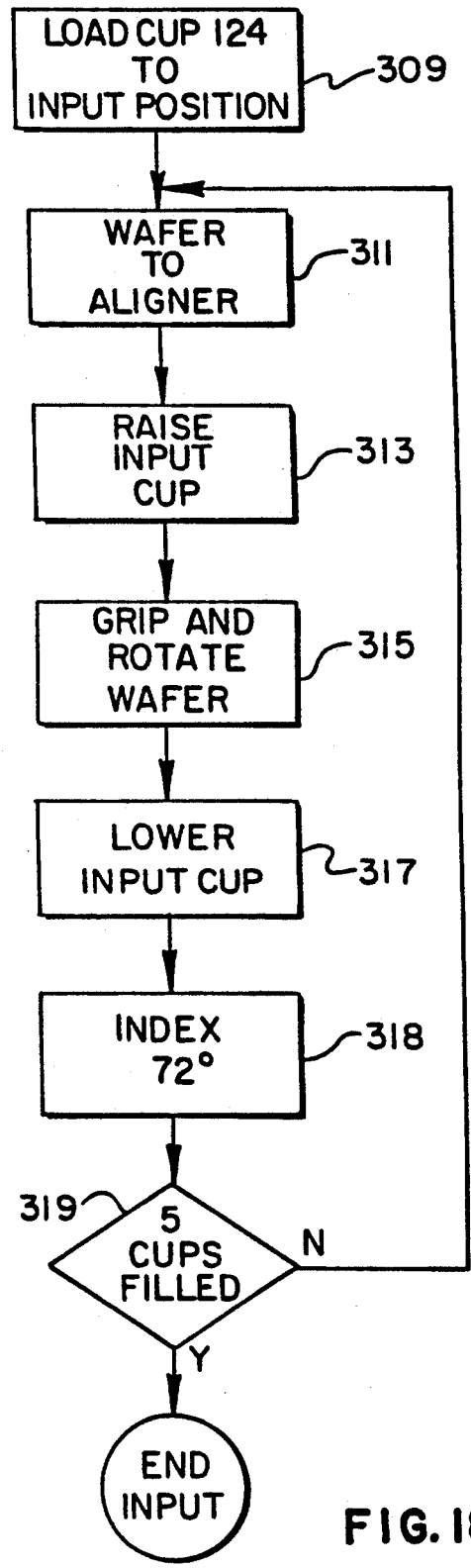

FIG. 15 is an electrical block diagram of the present apparatus showing control as exercised by computer 103. Most control is performed in closed feedback loops by sending a command on buses 450 and 450' from computer 103 to an action device and checking a sensor by the computer via buses 451 and 451', to assure that the commanded act was correctly performed to achieve a desired result. In FIG. 15, dashed lines are shown between various action devices, e.g., air cylinders 192, and one or more sensors, e.g., 202 and 407. These dashed lines associate components which are parts of a feedback loop. For example, pressure is maintained between a wafer and the polish table 134 by transmitting commands from computer 103 to analog air pressure control 401 interface, which controls one or more air cylinders 192, to apply a pressure specified in the command. The actual pressure applied to the polish table by each carrier, e.g. 139, is then read from a pressure sensor 202 via an interface 408 and adjusting commands are sent by computer 103 to air pressure control 401 to maintain the pressure at a desired level.

Figure 21:
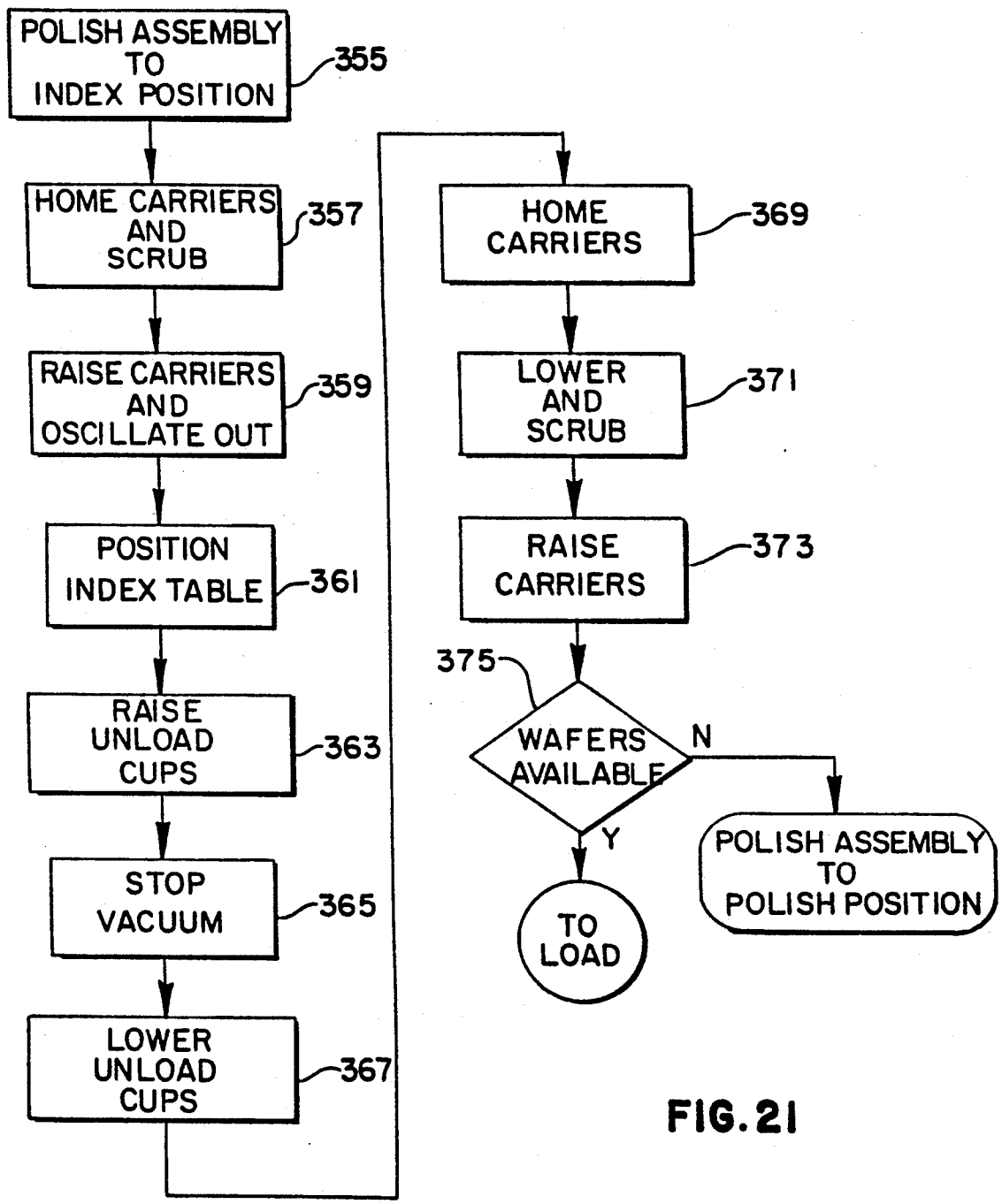
Figure 22:
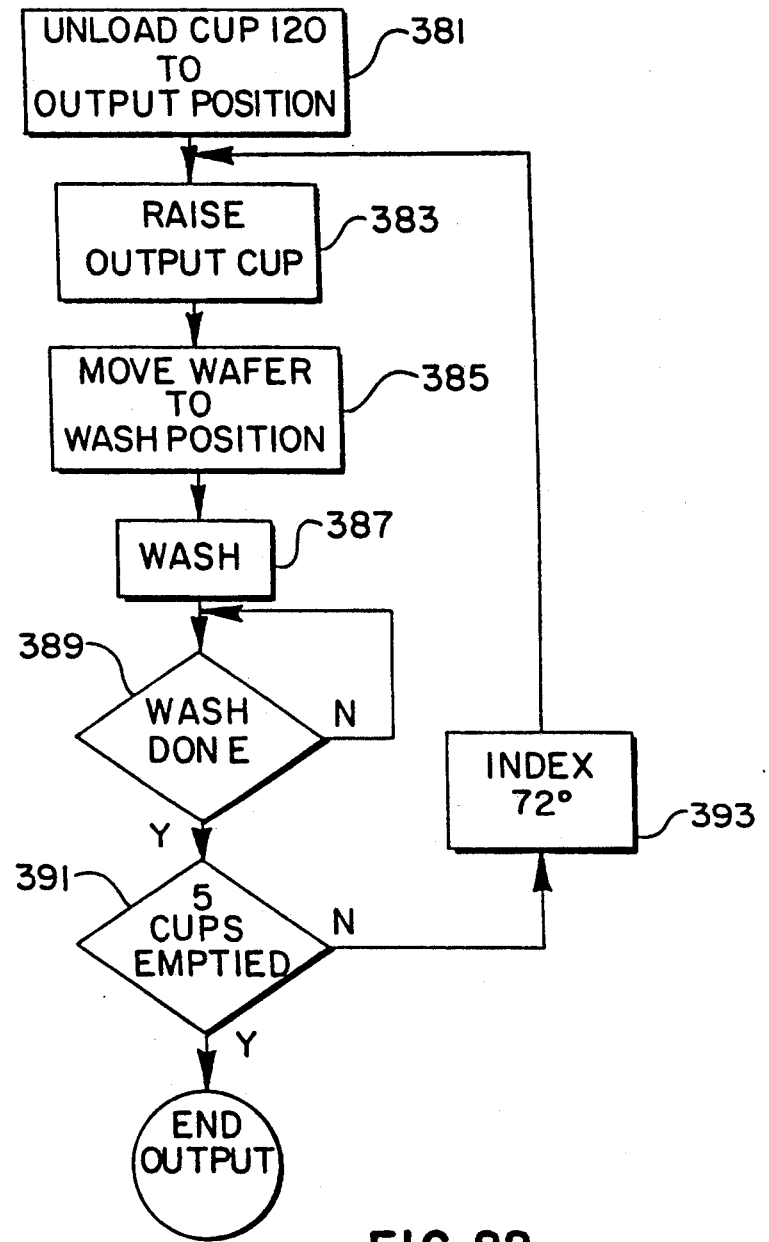

FIGS. 17 through 22 are flow diagrams of the wafer polishing process performed by system 100, as controlled by computer 103. The wafer polishing process includes six basic routines which are shown in the flow diagrams and discussed in detail below. The six basic routines are startup, input, output, load, unload, and polish. The startup routine (FIG. 17) is performed at "power on" and when new process variables are to be entered. The input routine is used to load unpolished wafers from input cassettes 106 to the index table 117. The input routine can be performed whenever input wafers are available, load cups 124-128 of index table 117 are available, and the polish assembly 132 is not using the index table. The output routine is performed whenever polished wafers are available in the unload cups 119–123, an output cassette 108 is available, and the polishing assembly 132 is not using the index table 117. The load routine (FIG. 19) is performed when the load cups 124–128 are full and the wafer carriers 139–143 are empty. The load routine is directly followed by the polish routine of FIG. 20. The unload routine of FIG. 21 is performed whenever the carriers 139–143 contain polished wafers and the unload cups 119–123 are empty. As can be seen from the foregoing, more than one of the routines can be performed at the same time. For example, during a polish routine, when the polishing assembly 132 does not require the index table 117, both the input and output routines can also be performed if indexing of the table 117 is coordinated.

The process begins with the start-up routine (FIG. 17) when an operator energizes the apparatus and inserts at least one input cassette 106 with wafers, and at least one empty output cassette 108, into the input/output module 101. Computer 103 responds in step 301 to "power on" by performing internal initialization routines of the well known type, and by initializing the system in a step 303. Such system initialization includes reading all sensors to determine the operability of the system. Next, step 304 is performed in which process variables are entered by an operator.

In the present embodiment, a video monitor 105 (FIG. 1) operates as a touch-screen device, permitting the entry of process variables. Other input devices, such as computer keyboards, could also be used. The process variables entered by the operator identify certain polishing specifics for each wafer carrier 139 through 143. For example, the operator can enter for each wafer carrier 139–143 the pressure to be applied on polish table 134, the rotation rate of the wafer carrier, the oscillation distance imparted by polishing arm 180, and the time that such pressure is to be maintained on the polishing table. The operator also specifies in step 304 the rotation speed of polish table 134 and amounts of slurry to be pumped to the table. The variables specified for one polishing arm 180 may differ from those specified for other arms but, in the embodiment which follows, it is assumed that all five wafer carriers 139 through 143 operate in accordance with the same process variables. Computer 103 stores the process variables for each polish arm 180 in different storage locations within the computer. The computer 103 uses the input process variables to establish ranges of actual sensed values from the sensors measuring the physical variables of the process.

After the process variables have been established and stored, step 305 is performed in which all five carriers 139 through 143 are raised, oscillated to the home position, and moved to the polish position. Step 305 is performed by transmitting commands via air pressure control 401, to control all five air cylinders 192 to raise their connected wafer carrier 139 through 143. Completion of raising is checked by reading five Hall effect limit detectors 407 via an interface 408. Oscillation to the home position is achieved by oscillation commands sent to oscillator servo interface 403, which applies power to the servo motors 190 to rotate the carriers to the home position. Proper oscillation is then checked by reading servo position sensors 409 of motors 190 (one associated with each servo motor 190) via interface 410. Next, a step 306 is performed in which polish table motor 280 is sent a command via interface 442 to achieve the rotation speed set in the process variables. Computer 103 periodically reads the output of a rate sensor 440 of motor 280 via an interface 441 to adjust the actual rotation speed of polish table 134. Finally, the position of polish assembly 132 is read from a position sensor 415 associated with servo motor 165 and, if the assembly is not in polish position, commands are sent to the servo motor 165 via an interface 417 to so move the assembly.

After placing the system 100 in a known condition, a step 307 is performed to determine if an input cassette 108 has been loaded into an input/output unit 101. Such a check may comprise reading by computer 103 a photoelectric cell sensor 119 in input/output unit 101. When no cassette is present, an alarm or other notice may be provided to stimulate action by the operator. Alternatively, when such cassette is present, the process enters the input routine (FIG. 18) at a step 309 which is performed to place the index table 117 in the input/output position, in which load cup 124 is in input position 129 adjacent to the input gripper 115. Step 309 comprises reading a position sensor 421 of index servo motor 131 to identify the position of index table 117, and commanding via interface 423 that servo motor 131 index by 36° if an unload cup, e.g. 119, is in input position 129. Alternatively, if load cup 124 is already in the input position 129, no indexing is performed. After the input position has been established, a command is transmitted in step 311 to input robot 111, directing that a wafer be moved from input cassette 106 to aligner 113. Proper alignment of the wafer by the aligner 113 can then be read by computer 103 to determine if the wafer movement and alignment action were successfully completed.

Upon proper alignment, a step 313 is performed in which the load cup 124, at the input position 129 is raised, and the input gripper 115 is commanded in step 315 to place the aligned wafer in the load cup. The load cup 124 is then lowered in a step 317 and servo motor 131 is commanded in step 318 to index by 72°. After indexing, a check 319 is performed to determine if a computer 103-maintained count of wafers shows that five have been placed on index table 117. When fewer than five have been so placed, and the wafer input routine begins again at step 311.

When all five load cups 124 through 128 contain wafers for polishing, the wafer load routine (FIG. 19) begins at step 321, after which the carriers 139 through 143 are in the raised and home positions. A polish assembly 132 move function then begins in step 323, which includes a command from computer 103 to clamp control 425 to unlock wedges 166 from support members 168, the performance of which is checked by reading a sensor 426. The polish assembly move function also includes a command to servo motor 165 to move the polish assembly 132 to the index table position, which movement is checked by reading position sensor 415 of servo motor 165.

After the carriers 139 through 143 are positioned over the index table 117, they are scrubbed in step 325 by being lowered and rotated against brush 146, while being sprayed with water from nozzles 147. The control of water spraying is represented in FIG. 15 by a water valve controller 428, which receives commands via an interface 429. In a step 327, the carriers 139 through 143 are raised by commands to air cylinders 192 and oscillated to their maximum outward position by commands to the five servo motors 202. The proper raising and oscillation of the carriers 139–143 is checked by reading sensors 407 and 409.

The position of the load cups 124 through 128 is checked in a step 328 to establish that load cup 124 is present in the input position 129, and if an unload cup is in that position, the table is indexed by 36°. When the load cups 124 through 128 are properly positioned, the load cups are raised in a step 329 by commands from computer 103 to an air cylinder controller 431 via an interface 430. A plurality of Hall effect sensors 432 are read by computer 103 to establish that proper air cylinder operation has occurred. The cups self-align with the carriers upon being raised, and computer 103 commands a vacuum control interface 434 to control five fluid valves 435, to apply vacuum from source 438 to the surfaces 261 of the carriers 139 through 143 via hoses to the fluid coupling input 211 (FIG. 10). The applied vacuum secures the wafers to the carriers 139 through 143 and the load cups are lowered to index table 117 in a step 333. Advantageously, vacuum level checks are performed by vacuum sensors 436 to assure that a wafer is present on each carrier 139 through 143 before the process continues. The state of sensors 436 is read by computer 103 via an interface 437. The wafer carriers 139 through 143 are then oscillated to the home position in step 335, and the servo motor 165 is commanded to move the polish assembly 132 to the polish position in a step 337.

Upon arrival at the polish position, the polish assembly is locked into position by a command to clamp control unit 425 and the polish routine (FIG. 20) begins at step 341. It should be mentioned that contemporaneously with polishing, the system 100 is free to perform the input routine to prepare new wafers for polishing and/or to perform an output routine to be described later herein, to remove polished wafers from index table 117.

In step 341, the polish table rotation speed is checked by reading rate sensor 440 via an interface 441 and the rotation rate is adjusted by commands to polish table motor 280 via interface 442. At this point, commands are sent via interface 405 (step 343) to servo motors 220 to begin their rotation at the rate specified by the operator in the input variables. Also, the carriers 139 through 143 are lowered and pressed against the revolving polish table 134 at the specified pressure, and the oscillation distance and speed of carriers 139 through 143 are maintained. Advantageously, pressure sensors 202, position sensors 409, and the rotation sensors 412 are frequently read by computer 103 during polishing, and appropriate adjustment commands are transmitted to carefully maintain all movements and forces within the ranges established for the levels specified by the operator in the input variables. Also, the slurry amount pumped onto polish table 134 is communicated to a slurry interface and the temperature of the polish table is controlled by computer 103 communication with heat exchanger 295 to maintain accurate polishing.

A timing step 349 begins to run when polishing begins and the wafer carriers 139 through 143 are raised (step 351) and their motion stopped when the time variable specified by the operator is achieved. If unload cups are then available, as is determined in step 353, the process flow proceeds to the unload routine (FIG. 21) at step 355.

In step 355, the polish assembly 132 is moved to the index table position, the carriers are lowered and scrubbed in a step 357, and are raised and oscillated to their maximum outward position in a step 359. In step 361, the position of index table 117 is sensed by computer 103 and, if necessary, the table is rotated so that unload cup 120 is in the input position 129. When the unload cups are in proper position, they are raised in step 363 to align with carriers 139 through 143 and vacuum control 434 is commanded to stop the vacuum at surfaces 261 to allow the wafers to drop into their respective unload cups. In actuality, it may be found necessary to also apply a fluid, such as water, at pressure, to the vacuum system to force the wafers from their respective surfaces 261. Such fluid introduction to the system is performed by computer 103 control of fluid valves 435, which are shown connected to a vacuum source 434 and to a pressurized water source 439 in FIG. 15.

When the wafers have dropped into unload cups 119 through 123, they are lowered to the surface of the index table 117 in step 367. Carriers 139 through 143 are then oscillated to the home position (step 369), lowered and scrubbed (step 371), and raised (step 373). A step 375 is then performed to determine if unpolished wafers are present in the load cups 124–128. When wafers are present in the load cups, load routine (FIG. 19) beginning at step 327 is performed.

When the polish assembly 132 has returned to the polish table, either with or without wafers for polishing, and polished wafers are present in the unload cups 119–123, the wafer output routine (FIG. 22) begins at step 381. In step 381, the index table position is checked and controlled, if needed, to place an unload cup 120 in the output cup position 131. The unload cup 120, at position 131, is then raised in step 383 by an output air cylinder 160, in response to commands from computer 103 to air cylinder controller 431. Output gripper 116 is then rotated in step 385 to the output position 131 and commanded by computer 103 to grip and return the wafer from the raised unload cup to wash station 230, where a wash is performed in step 387 by a combination of commands to air cylinder control 431, water control 428 and stepper motor control 445. When the wash is completed as identified in a timer step 389, a check is made in step 391 to determine whether more polished wafers are available in the unload cups 119 through 123 of index table 117, and, if so, the table is indexed by 72° and the input routine continues at step 383. When all unload cups 119 through 123 are empty, the output process ends.

While preferred embodiments of the invention have been illustrated, it will be obvious to those skilled in the art that various modifications and changes may be made thereto without departing from the scope of the invention as set forth in the attached claims.

For example, in the described embodiment five wafers are loaded, unloaded and polished at a time, in accordance with the same operator-entered process variables. The process variables for each polish arm may be different when they are entered. Also, for certain small batch processes or for testing purposes, fewer than five wafers may be a polished at a time. During the data entry phase some, e.g. 2, polish arms may be identified as idle and only three wafers rather than five will be placed on the index table, loaded, polished and unloaded.

What is claimed is:

1. Apparatus for polishing a surface of a thin wafer of material comprising:
   a polishing surface;

a polishing assembly comprising a plurality of wafer carriers for polishing wafers against said polishing surface;

index apparatus comprising a plurality of load means equal to the number of said wafer carriers, each said load means for holding a wafer to be polished;

first means for positioning said wafer carriers adjacent individual ones of said load means;

means for substantially simultaneously engaging wafers held by said load means with individual ones of said wafer carriers;

second means for positioning said wafer carriers in polishing engagement against said polishing surface; and means for moving said polishing assembly from a position at said polishing surface to a position at said index means.

2. Apparatus in accordance with claim 1 wherein said first positioning means comprises means for positioning said wafer carriers over said load means; and said means for engaging comprises means for raising said load means into engagement with said wafer carriers.

3. Apparatus in accordance with claim 1 comprising means for automatically loading wafers to be polished into said plurality of load means when said polishing assembly is positioned at said polishing surface.

4. Apparatus in accordance with claim 3 wherein said index means is mounted for rotating said load means about a central axis thereof by predetermined index amounts and said load means comprises means operative in synchronism with rotation of said index means for loading wafers to be polished into the load means one at a time.

5. Apparatus in accordance with claim 1 wherein said index means comprises a plurality of unload means for substantially simultaneously receiving a plurality of polished wafers from said wafer carriers; and said apparatus comprises means for automatically removing polished wafers from said unload means.

6. Apparatus for polishing the surface of a thin wafer of material comprising:

a polishing surface;

a polishing assembly comprising a plurality of wafer carriers each for holding a wafer in polishing contact with said polishing surface;

index apparatus comprising a plurality of unload means equal to the number of said wafer carriers;

means for moving said polishing assembly from a position at said polishing surface to a position at said index means; and means for substantially simultaneously placing wafers held by said wafer carriers into individual ones of said unload means.

7. Apparatus in accordance with claim 6 comprising means for automatically removing polished wafers from said plurality of unload means when said polishing surface is positioned at said polishing assembly.

8. Apparatus in accordance with claim 7 wherein said removing means removes said wafers from said unload means one at a time.

9. Apparatus in accordance with claim 8 wherein said index apparatus is mounted for rotating said unload means about a central axis by predetermined index amounts and said removing means comprises means operative in synchronism with rotation of said index apparatus for removing said wafers one at a time.

10. Apparatus in accordance with claim 7 wherein said means for automatically removing wafers comprises means for washing wafers after removal from said unload means.

11. Apparatus in accordance with claim 10 wherein said washing means comprises means for engaging a removed wafer between a plurality of rotating brushes and means for spraying said removed wafer with solvent.

12. Apparatus in accordance with claim 7 wherein said means for removing comprises means for placing removed wafers into a multi-wafer cassette.

13. Apparatus in accordance with claim 6 comprising washing means for washing the wafers held by said wafer carriers prior to the placement of those wafers in the unload means.

14. Apparatus for polishing a surface of a thin wafer of material comprising:

a polishing surface;

a polishing assembly comprising a plurality of wafer carriers for polishing wafers against said polishing surface;

index apparatus comprising a plurality of wafer holding means at least equal to the number of said wafer carriers, each said wafer holding means being capable of holding a wafer;

first means for positioning said wafer carriers adjacent individual ones of said wafer holding means;

means for substantially simultaneously exchanging a plurality of wafers between said wafer holding means and individual ones of said wafer carriers;

second means for positioning said wafer carriers in polishing engagement against said polishing surface; and means for moving said polishing assembly between a position at said polishing surface and a position at said index means.

* * * * *